United States Patent
Sasagawa et al.

(10) Patent No.: US 7,875,485 B2
(45) Date of Patent: Jan. 25, 2011

(54) METHODS OF FABRICATING MEMS DEVICES HAVING OVERLYING SUPPORT STRUCTURES

(75) Inventors: Teruo Sasagawa, Los Gatos, CA (US); SuryaPrakash Ganti, Los Altos, CA (US); Mark W. Miles, Atlanta, GA (US); Clarence Chui, San Jose, CA (US); Manish Kothari, Cupertino, CA (US); Ming-Hau Tung, San Francisco, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 12/510,046

(22) Filed: Jul. 27, 2009

(65) Prior Publication Data

US 2010/0019336 A1  Jan. 28, 2010

Related U.S. Application Data

(62) Division of application No. 11/490,880, filed on Jul. 21, 2006, now Pat. No. 7,566,940.

(60) Provisional application No. 60/701,655, filed on Jul. 22, 2005, provisional application No. 60/710,019, filed on Aug. 19, 2005.

(51) Int. Cl.
*H01L 21/00* (2006.01)

(52) U.S. Cl. .............................. 438/53; 438/48; 438/50; 438/52

(58) Field of Classification Search ............. 438/48–54; 257/190, 528, 414–420
See application file for complete search history.

(56) References Cited

U.S. PATENT DOCUMENTS

| | | | |
|---|---|---|---|
| 4,566,935 A | 1/1986 | Hornbeck | |
| 4,710,732 A | 12/1987 | Hornbeck | |
| 4,859,060 A | 8/1989 | Katagiri et al. | |
| 4,956,619 A | 9/1990 | Hornbeck | |

(Continued)

FOREIGN PATENT DOCUMENTS

CN      092109265      4/2003

(Continued)

OTHER PUBLICATIONS

Dai et al., "A CMOS surface micromachined pressure sensor," Journal of the Chinese institute of Engineers, 1999, vol. 22, No. 3 (May), pp. 375-380.

(Continued)

*Primary Examiner*—Dung A. Le
(74) *Attorney, Agent, or Firm*—Knobbe Martens Olson & Bear LLP

(57) ABSTRACT

Embodiments of MEMS devices comprise a conductive movable layer spaced apart from a conductive fixed layer by a gap, and supported by rigid support structures, or rivets, overlying depressions in the conductive movable layer, or by posts underlying depressions in the conductive movable layer. In certain embodiments, portions of the rivet structures extend through the movable layer and contact underlying layers. In other embodiments, the material used to form the rigid support structures may also be used to passivate otherwise exposed electrical leads in electrical connection with the MEMS devices, protecting the electrical leads from damage or other interference.

39 Claims, 38 Drawing Sheets

U.S. PATENT DOCUMENTS

| | | |
|---|---|---|
| 5,233,456 A | 8/1993 | Nelson |
| 5,287,215 A | 2/1994 | Warde et al. |
| 5,454,906 A | 10/1995 | Baker et al. |
| 5,485,304 A | 1/1996 | Kaeriyama |
| 5,497,262 A | 3/1996 | Kaeriyama |
| 5,526,172 A | 6/1996 | Kanack |
| 5,526,951 A | 6/1996 | Bailey |
| 5,600,383 A | 2/1997 | Hornbeck |
| 5,606,441 A | 2/1997 | Florence et al. |
| 5,631,782 A | 5/1997 | Smith et al. |
| 5,646,768 A | 7/1997 | Kaeiyama |
| 5,650,881 A | 7/1997 | Hornbeck |
| 5,673,139 A | 9/1997 | Johnson |
| 5,745,281 A | 4/1998 | Yi et al. |
| 5,751,469 A | 5/1998 | Arney et al. |
| 5,783,864 A | 7/1998 | Dawson et al. |
| 5,784,212 A | 7/1998 | Hornbeck |
| 5,808,781 A | 9/1998 | Arney et al. |
| 5,825,528 A | 10/1998 | Goosen |
| 5,835,255 A | 11/1998 | Miles |
| 5,838,484 A | 11/1998 | Goossen et al. |
| 5,867,302 A | 2/1999 | Fleming et al. |
| 5,914,803 A | 6/1999 | Hwang et al. |
| 5,920,421 A | 7/1999 | Choi |
| 5,998,293 A | 12/1999 | Dawson et al. |
| 6,038,056 A | 3/2000 | Florence et al. |
| 6,040,937 A | 3/2000 | Miles |
| 6,100,477 A | 8/2000 | Randall et al. |
| 6,284,560 B1 | 9/2001 | Jech et al. |
| 6,358,021 B1 | 3/2002 | Cabuz |
| 6,447,126 B1 | 9/2002 | Hornbeck |
| 6,465,355 B1 | 10/2002 | Horsley |
| 6,574,033 B1 | 6/2003 | Chui et al. |
| 6,602,791 B2 | 8/2003 | Ouellet et al. |
| 6,618,187 B2 | 9/2003 | Pilossof |
| 6,632,698 B2 | 10/2003 | Ives |
| 6,650,455 B2 | 11/2003 | Miles |
| 6,657,832 B2 | 12/2003 | Williams et al. |
| 6,674,562 B1 | 1/2004 | Miles |
| 6,677,225 B1 | 1/2004 | Ellis et al. |
| 6,680,792 B2 | 1/2004 | Miles |
| 6,713,235 B1 | 3/2004 | Ide et al. |
| 6,778,306 B2 | 8/2004 | Sniegowski et al. |
| 6,788,175 B1 | 9/2004 | Prophet et al. |
| 6,794,119 B2 | 9/2004 | Miles |
| 6,867,896 B2 | 3/2005 | Miles |
| 6,882,458 B2 | 4/2005 | Lin et al. |
| 6,951,824 B2 | 10/2005 | Fischer et al. |
| 6,967,757 B1 | 11/2005 | Allen et al. |
| 6,987,432 B2 | 1/2006 | Lutz et al. |
| 6,991,995 B2 | 1/2006 | Aulnette et al. |
| 6,995,890 B2 | 2/2006 | Lin |
| 7,078,293 B2 | 7/2006 | Lin et al. |
| 7,119,945 B2 | 10/2006 | Cummings et al. |
| 7,123,216 B1 | 10/2006 | Miles |
| 7,198,973 B2 | 4/2007 | Lin et al. |
| 7,250,315 B2 | 7/2007 | Miles |
| 7,327,510 B2 | 2/2008 | Cummings et al. |
| 7,405,863 B2 | 7/2008 | Tung et al. |
| 7,420,728 B2 | 9/2008 | Tung et al. |
| 7,429,334 B2 | 9/2008 | Tung et al. |
| 7,485,236 B2 | 2/2009 | Lin |
| 7,486,867 B2 | 2/2009 | Wang |
| 7,534,640 B2 | 5/2009 | Faase et al. |
| 7,545,552 B2 | 6/2009 | U'Ren |
| 7,556,917 B2 | 7/2009 | Miles |
| 7,566,940 B2 | 7/2009 | Sasagawa et al. |
| 7,616,369 B2 | 11/2009 | Miles et al. |
| 2001/0040675 A1 | 11/2001 | True et al. |
| 2002/0024711 A1 | 2/2002 | Miles |
| 2002/0027636 A1 | 3/2002 | Yamada |
| 2002/0054422 A1 | 5/2002 | Carr et al. |
| 2002/0058422 A1 | 5/2002 | Jang et al. |
| 2002/0071169 A1 | 6/2002 | Bowers et al. |
| 2002/0110948 A1 | 8/2002 | Huang et al. |
| 2002/0146200 A1 | 10/2002 | Kudrie et al. |
| 2002/0186483 A1 | 12/2002 | Hagelin et al. |
| 2003/0016428 A1 | 1/2003 | Kato et al. |
| 2003/0053078 A1 | 3/2003 | Missey et al. |
| 2003/0053233 A1 | 3/2003 | Felton |
| 2003/0123126 A1 | 7/2003 | Meyer et al. |
| 2003/0210851 A1 | 11/2003 | Fu et al. |
| 2003/0231373 A1 | 12/2003 | Kowarz et al. |
| 2004/0027671 A1 | 2/2004 | Wu et al. |
| 2004/0035821 A1 | 2/2004 | Doan et al. |
| 2004/0051929 A1 | 3/2004 | Sampsell et al. |
| 2004/0080035 A1 | 4/2004 | Delapierre |
| 2004/0100677 A1 | 5/2004 | Huibers et al. |
| 2004/0100680 A1 | 5/2004 | Huibers et al. |
| 2004/0125347 A1 | 7/2004 | Patel et al. |
| 2004/0136045 A1 | 7/2004 | Tran |
| 2004/0207497 A1 | 10/2004 | Hsu et al. |
| 2004/0207897 A1 | 10/2004 | Lin |
| 2004/0207898 A1 | 10/2004 | Lin et al. |
| 2004/0209195 A1 | 10/2004 | Lin |
| 2004/0233498 A1 | 11/2004 | Starkweather et al. |
| 2005/0024557 A1 | 2/2005 | Lin |
| 2005/0036095 A1 | 2/2005 | Yeh et al. |
| 2005/0195464 A1 | 9/2005 | Faase et al. |
| 2006/0024620 A1 | 2/2006 | Nikkel et al. |
| 2006/0066936 A1 | 3/2006 | Chui et al. |
| 2006/0077509 A1 | 4/2006 | Tung et al. |
| 2006/0079048 A1 | 4/2006 | Sampsell et al. |
| 2006/0203325 A1 | 9/2006 | Faase et al. |
| 2007/0019923 A1 | 1/2007 | Sasagawa et al. |
| 2007/0047900 A1 | 3/2007 | Sampsell et al. |
| 2007/0064760 A1 | 3/2007 | Kragh |
| 2007/0269748 A1 | 11/2007 | Miles |
| 2008/0030825 A1 | 2/2008 | Sasagawa et al. |
| 2008/0041817 A1 | 2/2008 | Lin |
| 2008/0055699 A1 | 3/2008 | Lin |
| 2010/0147790 A1 | 6/2010 | Sasagawa et al. |
| 2010/0149627 A1 | 6/2010 | Sasagawa et al. |

FOREIGN PATENT DOCUMENTS

| | | |
|---|---|---|
| DE | 198 47 455 | 4/2004 |
| EP | 0 069 226 | 1/1983 |
| EP | 0 695 959 | 2/1996 |
| EP | 0 788 005 | 8/1997 |
| EP | 1 275 997 | 1/2003 |
| EP | 1 486 999 | 12/2004 |
| JP | 9-127439 | 5/1997 |
| JP | 11-097799 | 4/1999 |
| JP | 2001-085519 | 3/2001 |
| JP | 2002-062490 | 2/2002 |
| JP | 2002-207182 | 7/2002 |
| JP | 2004-212656 | 7/2004 |
| WO | WO 98/14804 | 4/1998 |
| WO | WO 02/079853 | 10/2002 |
| WO | WO 03/014789 | 2/2003 |
| WO | WO 2004/015741 | 2/2004 |
| WO | WO 2004/055885 | 7/2004 |

OTHER PUBLICATIONS

Fan et al., "Channel Drop Filters in Photonic Crystals," Optics Express, vol. 3, No. 1 (1998).

Raley et al., "A Fabry-Perot Microinterferometer for Visible Wavelengths," IEEE Solid-State Sensor and Actuator Workshop, Hilton Head, SC, pp. 170-173 (1992).

Wang et al., Flexible circuit-based RF MEMS Switches, Proceedings of 2001 ASME International Mechanical Engineering Congress and Exposition, pp. 1-6, 2001.

ISR and WO for PCT/US06/028342 filed Jul. 20, 2006.

IPRP for PCT/US06/028342 filed Jul. 20, 2006.

Office Action dated May 19, 2008 in U.S. Appl. No. 11/490,880.

Office Action dated Sep. 22, 2008 in U.S. Appl. No. 11/490,880.

Office Action dated Jul. 9, 2010 in U.S. Appl. No. 11/491,490.

Official Communication dated May 21, 2010 in European App. No. 06788092.2.

Office Action cited in counterpart Chinese Patent Application No. 200680026806.1 issued Mar. 26, 2010.

Office Action dated Dec. 2, 2009 in U.S. Appl. No. 11/491,490.

METHODS OF FABRICATING MEMS DEVICES HAVING OVERLYING SUPPORT STRUCTURES

CROSS-REFERENCE TO RELATED APPLICATIONS

This application is a divisional of U.S. patent application Ser. No. 11/490,880, filed on Jul. 21, 2006, now U.S. Pat. No. 7,566,940, which claims priority under 35 U.S.C. §119(e) to U.S. Provisional Application Ser. Nos. 60/701,655, filed on Jul. 22, 2005, and 60/710,019, filed Aug. 19, 2005, each of which is hereby incorporated by reference in its entirety.

BACKGROUND OF THE INVENTION

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

In one embodiment, a method of fabricating a MEMS device, is provided, including providing a substrate, depositing an electrode layer over the substrate, depositing a sacrificial layer over the electrode layer, patterning the sacrificial layer to form apertures, depositing a movable layer over the sacrificial layer, forming support structures overlying the movable layer and at least partially within apertures in the sacrificial layer, and etching the sacrificial layer to remove the sacrificial layer, forming a cavity between the movable layer and the electrode layer.

In another embodiment, a MEMS device is provided, including a substrate, an electrode layer located over the substrate, a movable layer located over the electrode layer, wherein the movable layer is generally spaced apart from the electrode layer by an air gap, and wherein the movable layer includes depressions in support regions, and rigid support structures formed over the movable layer and at least partially within the depressions in the movable layer.

In another embodiment, a MEMS device is provided, including first means for electrically conducting, second means for electrically conducting, and means for supporting the second conducting means over the first conducting means, wherein the supporting means overlie portions of the second means for electrically conducting, and wherein the second conducting means is movable relative to the first conducting means in response to generating electrostatic potential between the first and second conducting means.

DETAILED DESCRIPTION OF THE PREFERRED EMBODIMENT

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Individual MEMS elements, such as interferometric modulator elements, may be provided with support structures both within and at the edges of individual elements. In certain embodiments, these support structures may include support layers located over depressions in a movable layer. By forming these structures from rigid material such as aluminum or oxides, stability of the operation of the MEMS device can be improved as compared with structures formed from less rigid material. In addition, the use of rigid material alleviates problems with gradual degradation or deformation of the support structures over time, which can lead to a gradual shift in the color reflected by a given pixel. In addition, because these support structures overlie the MEMS device, they can be made as thick as necessary without interfering with the operation of the MEMS device. In certain embodiments, overlying support structures may extend through a movable layer to contact underlying fixed layers, anchoring and/or propping edge portions of the overlying support structure to the underlying layers. In other embodiments, residual patches of support material may be used to stiffen portions of the movable layer, or to passivate exposed leads within or around the MEMS device.

Figure 1:
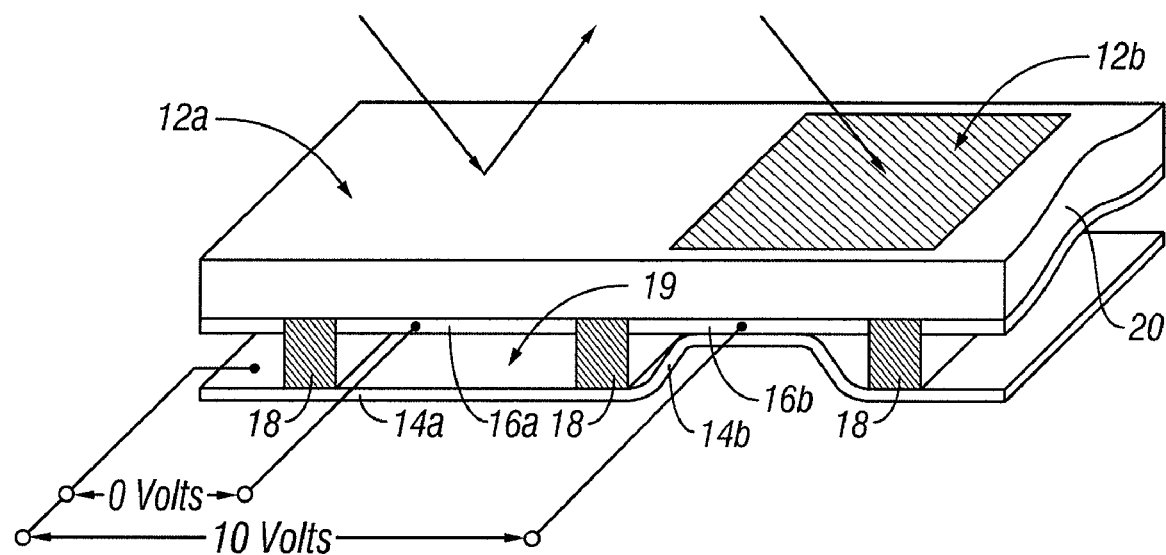
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
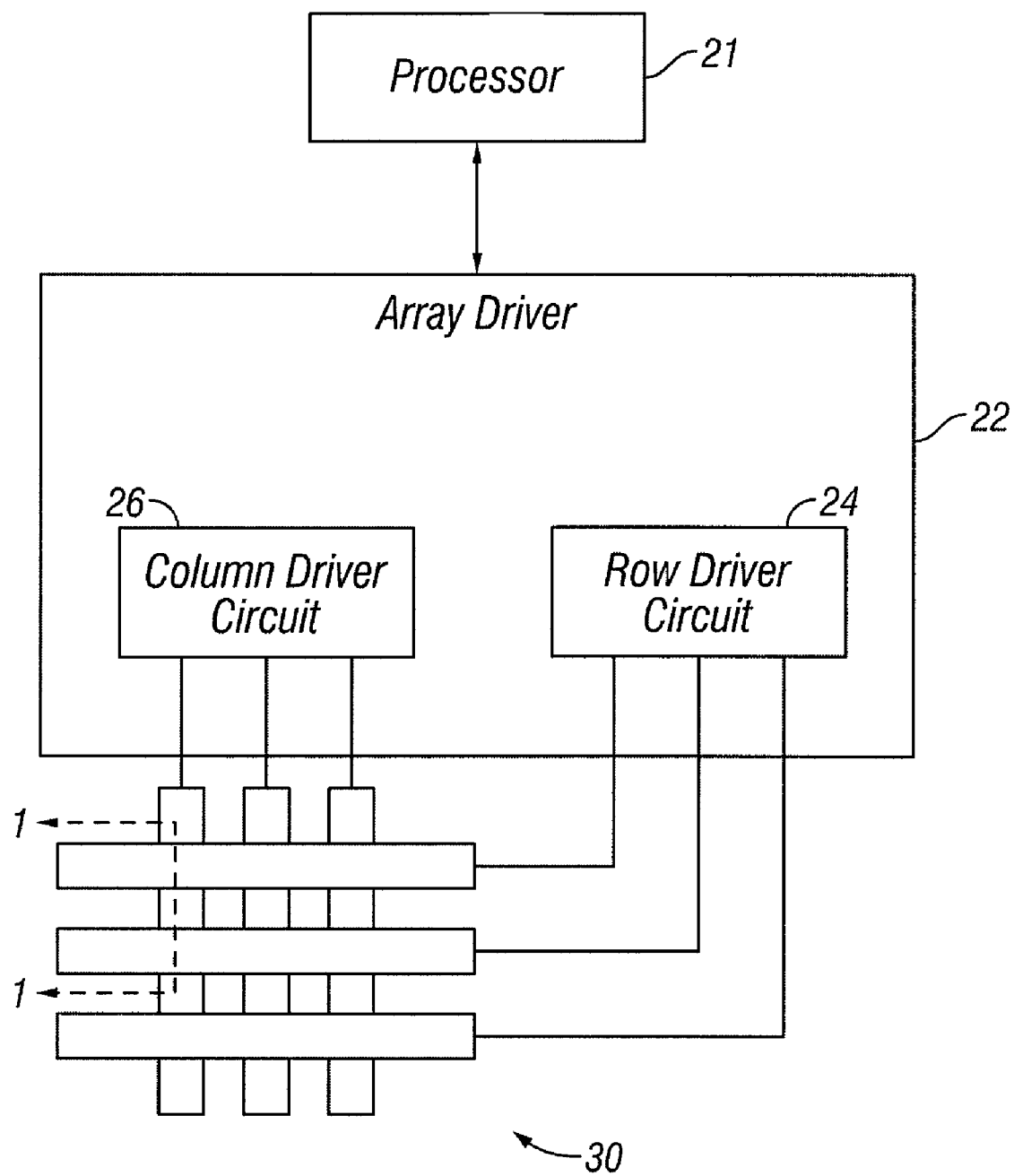
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single-or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
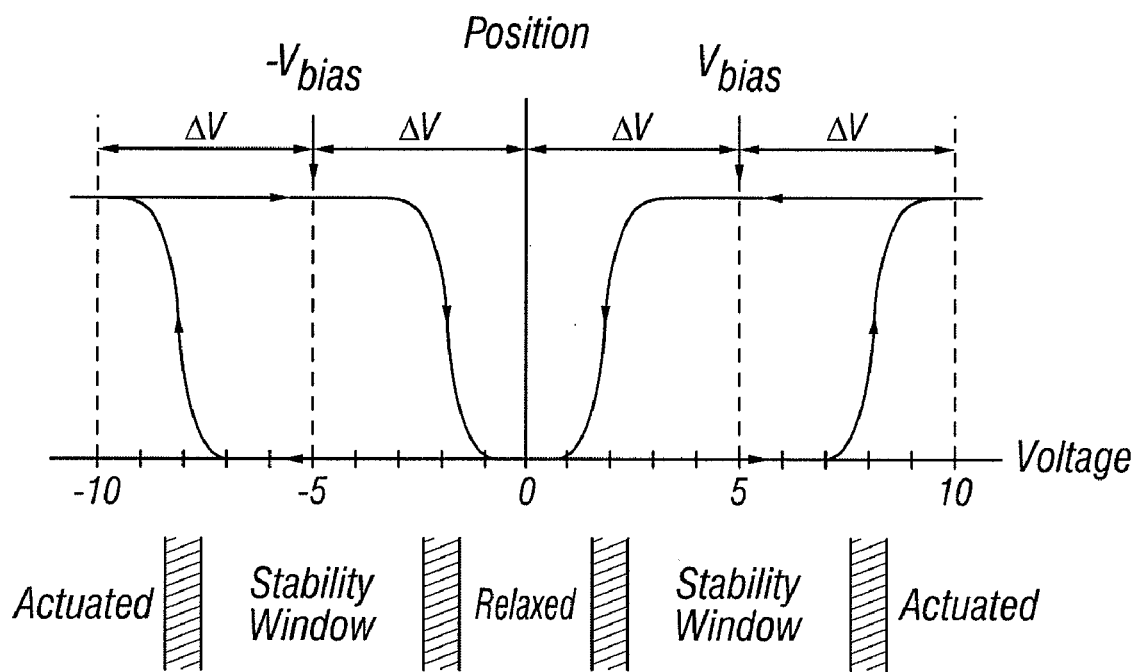
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
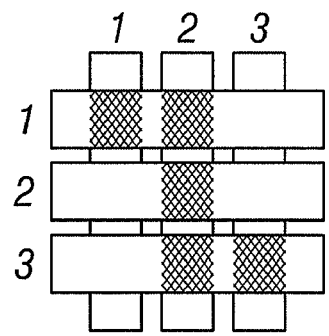
FIG. 5A illustrates one exemplary frame of display data in the 3×3 interferometric modulator display of FIG. 2.
Figure 5B:
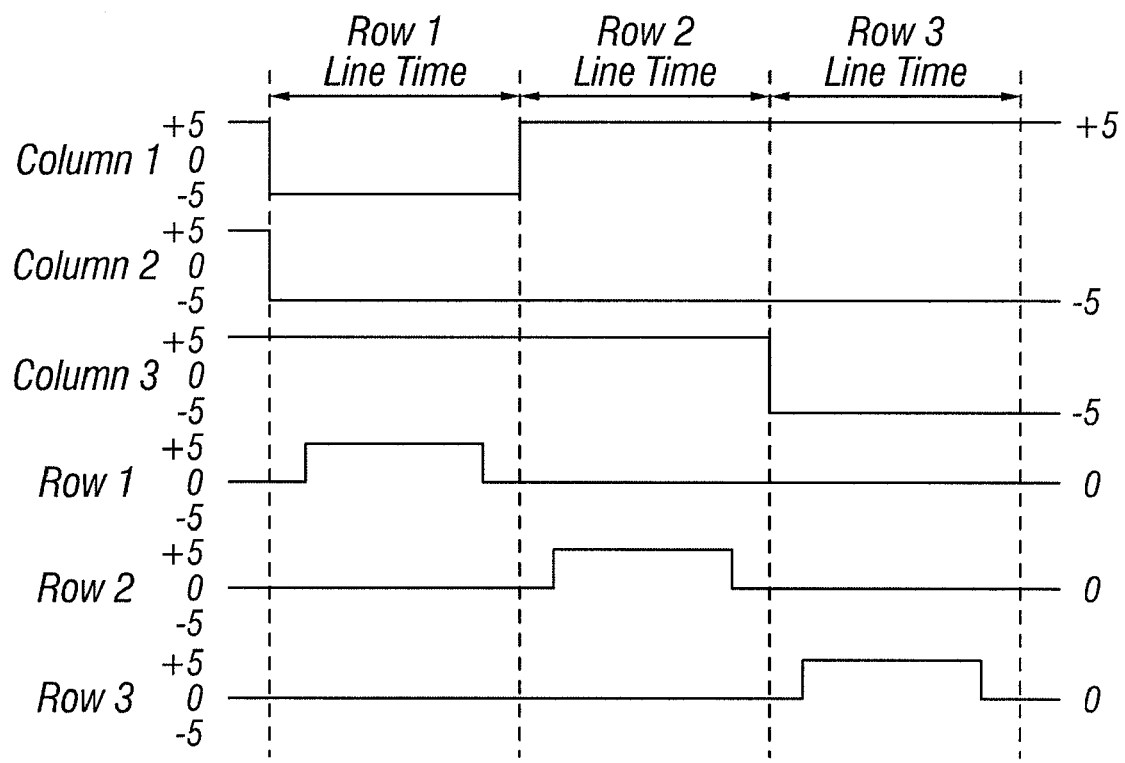
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment actuating a pixel involves setting the appropriate column to $-V_{bias}$, and the appropriate row to $+\Delta V$, which may correspond to $-5$ volts and $+5$ volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
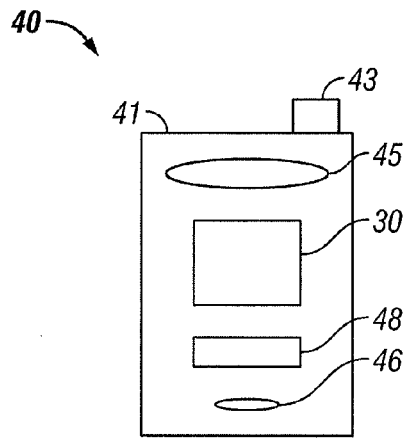
FIGS. 6A and 6B are system block diagrams illustrating an embodiment of a visual display device comprising a plurality of interferometric modulators.
Figure 6B:
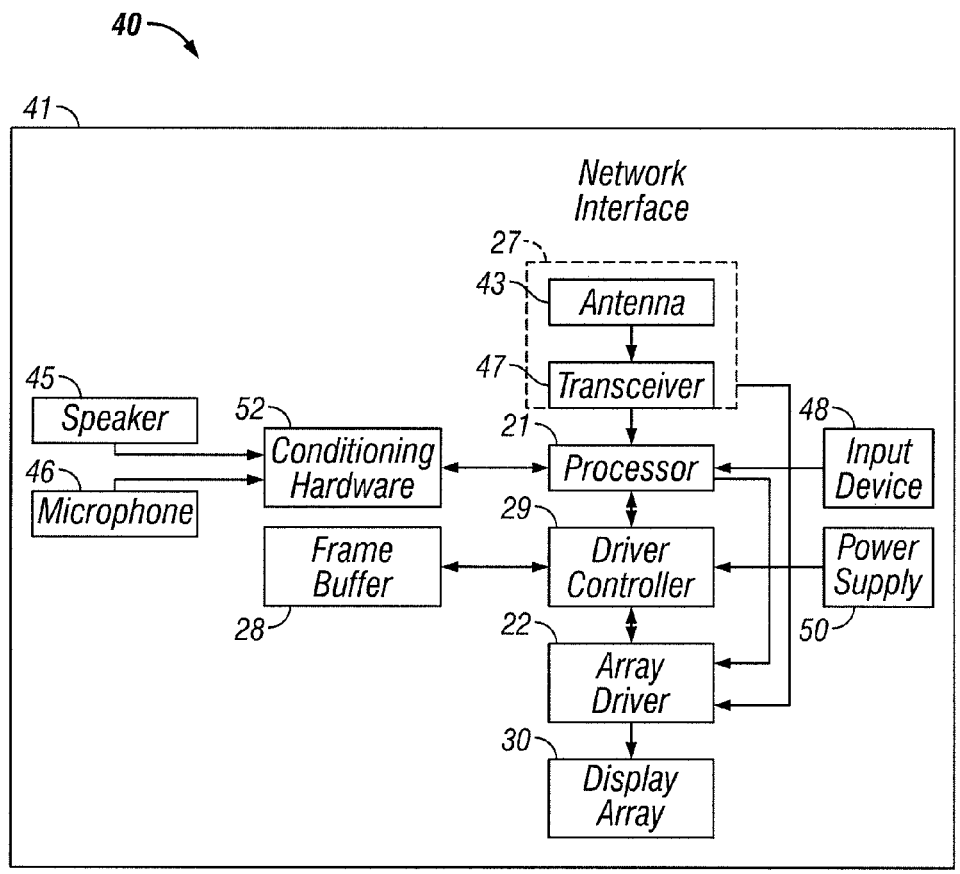

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of the exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of the exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUE-TOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be memory device such as a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, the array driver 22, and the display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell including a plastic solar cell, and solar-cell paint. In another embodiment, the power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
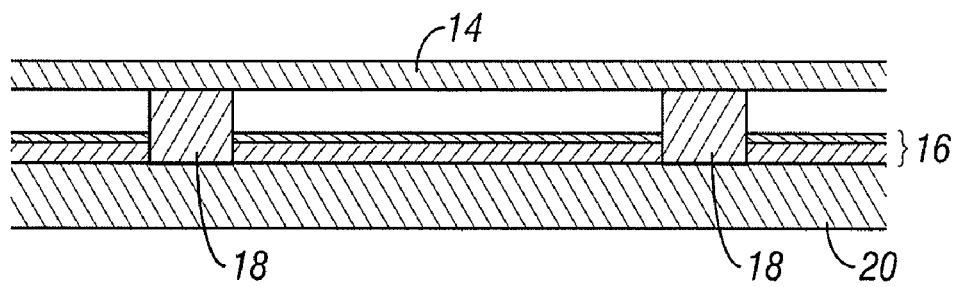
FIG. 7A is a cross section of the device of FIG. 1.
Figure 7B:
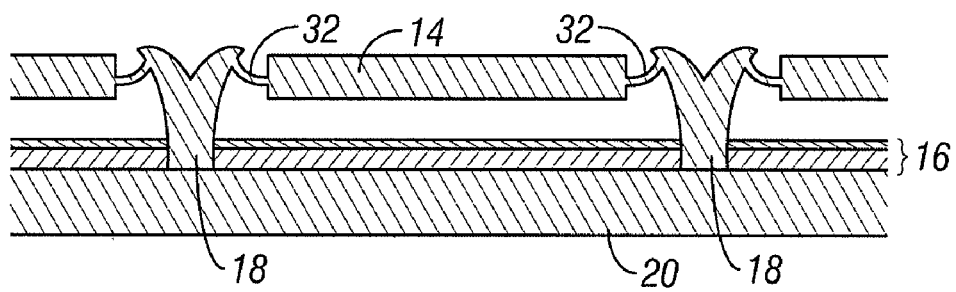
FIG. 7B is a cross section of an alternative embodiment of an interferometric modulator.
Figure 7C:
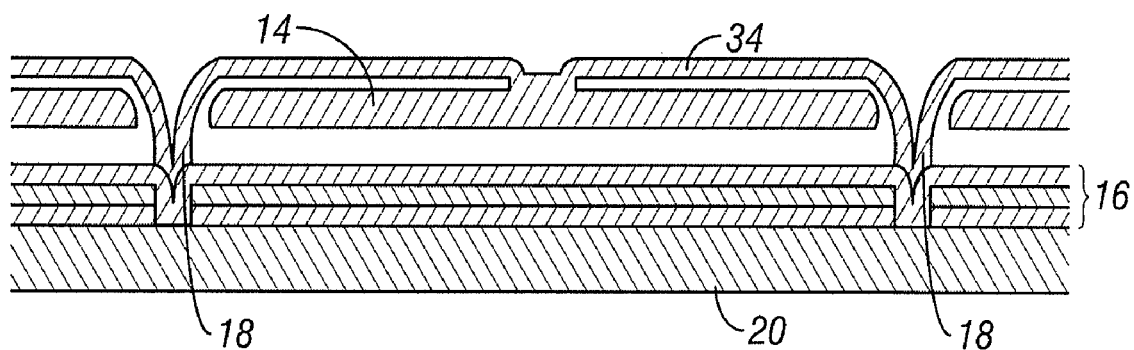
FIG. 7C is a cross section of another alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports 18 at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support structures, which can take the form of isolated pillars or posts and/or continuous walls or rails. The embodiment illustrated in FIG. 7D has support structures 18 that include support plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts 18 are formed of a planarization material, which is used to form the support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 7D:
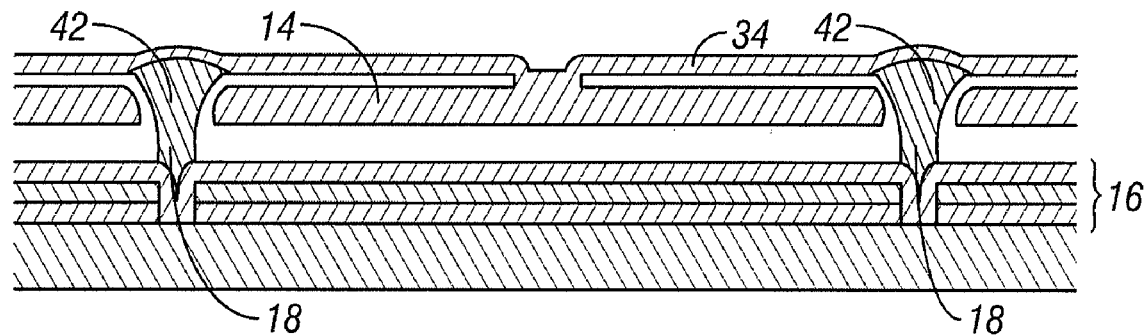
FIG. 7D is a cross section of yet another alternative embodiment of an interferometric modulator.
Figure 7E:
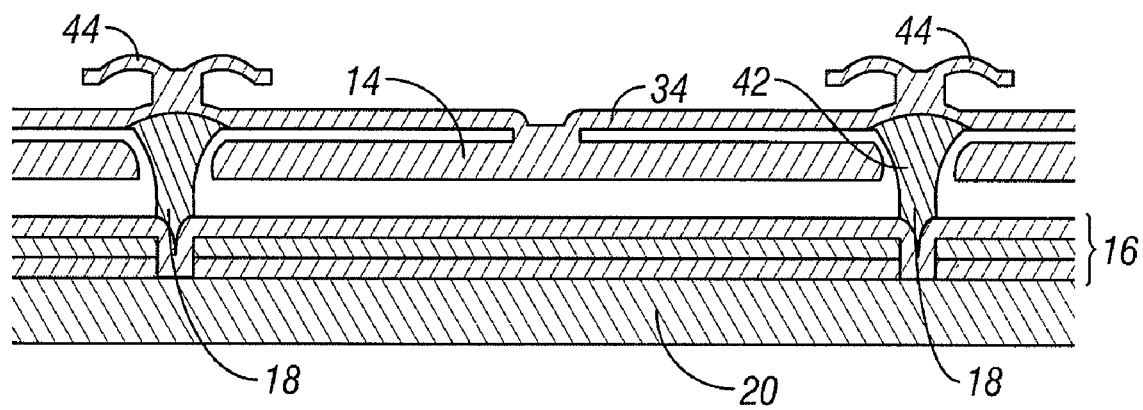
FIG. 7E is a cross section of an additional alternative embodiment of an interferometric modulator.

In certain embodiments, it may be desirable to provide additional support to a movable layer such as the movable reflective layer 14 illustrated in FIG. 7A, or the combination of mechanical layer 34 and movable reflective layer 14 of FIGS. 7C-7E. The movable layer may comprise a reflective sublayer and a mechanical sublayer, as will be discussed in greater detail below. Such support may be provided by a series of support structures which may be located both along the edges of an individual modulator element and in the interior of such an element. In various embodiments, these support structures may be located either over or underneath a movable layer. In alternate embodiments, support structures may extend through an aperture formed in the mechanical layer, such that support is provided from both above and below the mechanical layer. As used herein, the term "rivet" generally refers to a patterned layer overlying a mechanical layer in a MEMS device, usually in a recess or depression in the post or support region, to lend mechanical support for the mechanical layer. Preferably, though not always, the rivet includes wings overlying an upper surface of the mechanical layer to add stability and predictability to the mechanical layer's movement. Similarly, support structures underlying a mechanical layer in a MEMS device to lend mechanical support for the mechanical layer are generally referred to herein as support "posts." In many of the embodiments herein, the preferred materials are inorganic for stability relative to organic resist materials.

Figure 8:
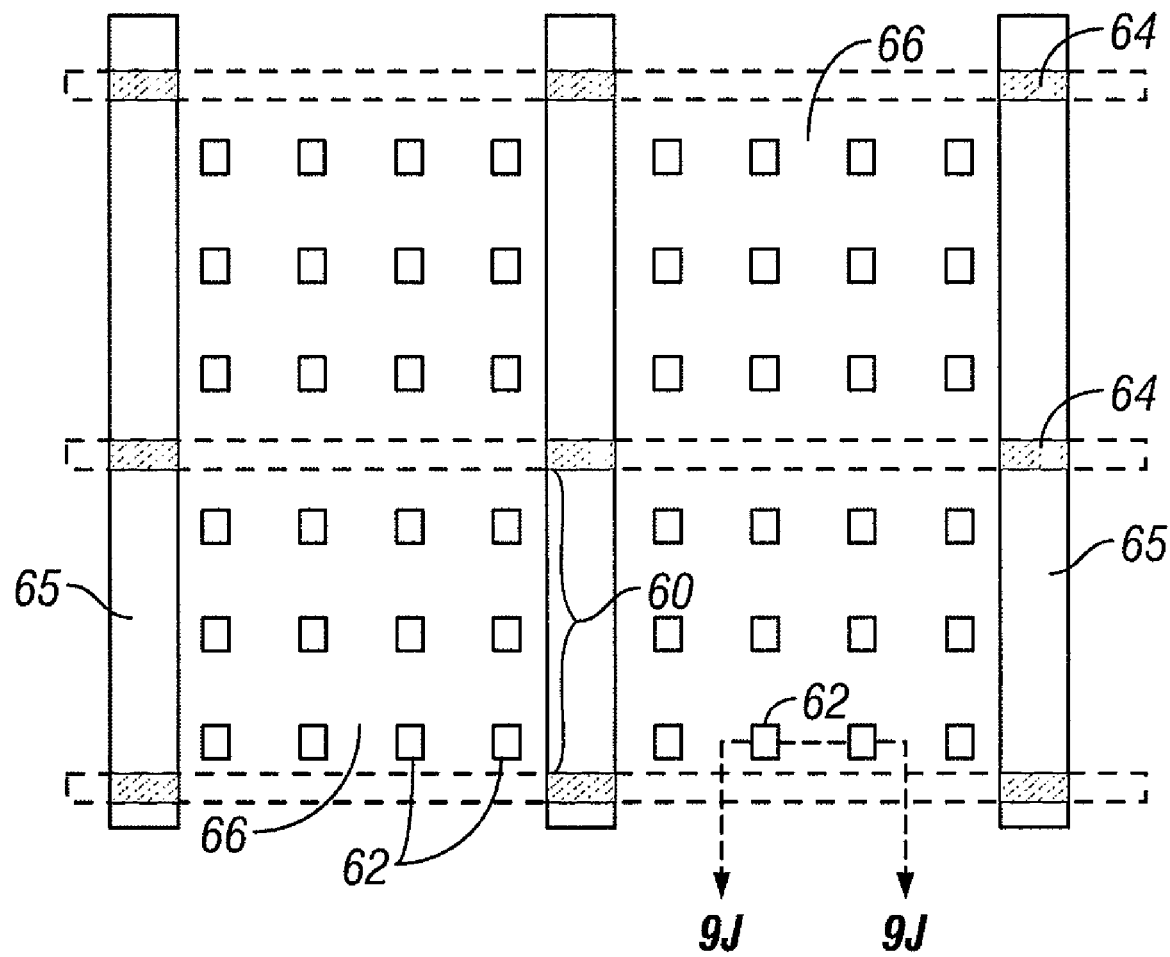
FIG. 8 is a top view of an array of interferometric modulator elements in which the individual elements comprise support structures.

An exemplary layout of such support structures is shown in FIG. 8, which depicts an array of MEMS elements. In certain embodiments, the array may comprise an array of interferometric modulators, but in alternate embodiments, the MEMS elements may comprise any MEMS device having a movable layer. It can be seen that support structures 62, which in the illustrated embodiment are overlying rivet structures 62, are located both along the edges of a movable layer 66 and in the interior of a MEMS element, in this example an interferometric modulator element 60. Certain support structures may comprise rail structures 64, which extend across the gap between two adjacent movable layers 66. It can be seen that movable layer 66 comprises a strip of deformable material extending through multiple adjacent elements 60 within the same column. The support structures 62 serve to stiffen the movable layer 66 within the elements or pixels 60.

Advantageously, these support structures 62 are made small relative to the surrounding area of the modulator element 60. As the support posts constrain deflection of the movable layer 66 and may generally be opaque, the area underneath and immediately surrounding the support structures 62 is not usable as active area in a display, as the movable layer in those areas is not movable to a fully actuated position (e.g., one in which a portion of the lower surface of the movable layer 14 of FIG. 7A is in contact with the upper surface of the optical stack 16). Because this may result in undesirable optical effects in the areas surrounding the post, a mask layer may advantageously be provided between the support structures and the viewer to avoid excessive reflection in these regions that may wash out the intended color.

In certain embodiments, these support structures may comprise a depression in the movable layer, along with a substantially rigid structure which helps to maintain the shape. While such support structures may be formed of a polymer material, an inorganic material having greater rigidity is preferably used, and provides advantages over similar structures comprising polymeric materials.

For instance, a polymeric support structure may not maintain a desired level of rigidity over a wide range of operating temperatures, and may be subject to gradual deformation or mechanical failure over the lifetime of a device. As such failures may affect the distance between the movable layer and the optical stack, and this distance at least partially determines the wavelengths reflected by the interferometric modulator element, such failures may lead to a shift in the reflected color due to wear over time or variance in operating temperatures. Other MEMS devices experience analogous degradation over time when supports are formed of polymeric material.

Figure 9A:
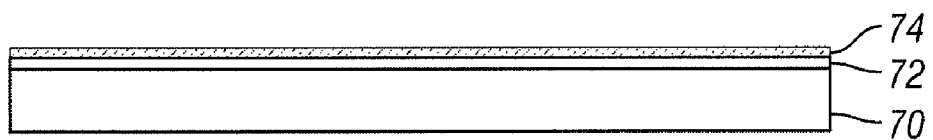
FIGS. 9A-9J are schematic cross-sections illustrating a method for fabricating an interferometric modulator element comprising support structures located over a movable layer.

One process for forming an interferometric modulator element comprising overlying rivet support structures is described with respect to FIGS. 9A-9J. In FIG. 9A, it can be seen that a transparent substrate 70 is provided, which may comprise, for example, glass or a transparent polymeric material. A conductive layer 72, which may comprise indium-tin-oxide (ITO) is then deposited over the transparent substrate, and a partially reflective layer 74, which may comprise chromium, is deposited over the conductive layer 72. Although in one embodiment conductive layer 72 may comprise ITO, and may be referred to as such at various points in the below specification, it will be understood that the layer 72 may comprise any suitable conductive material, and need not be transparent for non-optical MEMS structures. Similarly, although sometimes referred to as a chromium layer, partially reflective layer 74 may comprise any suitable partially reflective layer, and may be omitted for non-optical MEMS structures.

Figure 9B:
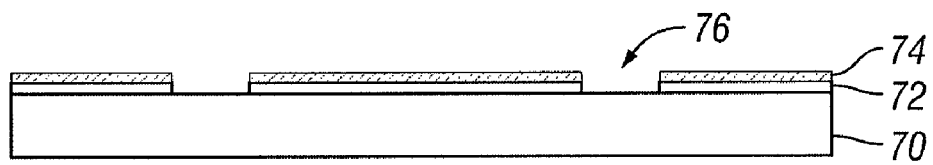

The conductive layer 72 and partially reflective layer 74 are then patterned and etched to form bottom electrodes, also referred to as row electrodes, which run perpendicular to the movable layer 66 of FIG. 8. In certain embodiments, the conductive and partially reflective layers 72 and 74 may advantageously also be patterned and etched to remove the ITO and chromium underlying the areas where the support post structures will be located, forming apertures 76 as depicted in FIG. 9B. This patterning and etching is preferably done by the same process which forms the row electrodes. The removal of ITO and chromium (or other conductive materials) underlying the support structures helps to prevent shorting between the movable layer and the bottom electrode. Thus, FIG. 9B and the subsequent figures depict a cross-section of a continuous row electrode formed by layers 72 and 74, in which apertures 76 have been etched, taken along a line extending through those apertures. In other embodiments in which the conductive layer 72 and partially reflective layer 74 are not etched to form apertures 76, a dielectric layer, discussed below, may provide sufficient protection against shorting between the bottom electrode and the movable layer.

Figure 9C:
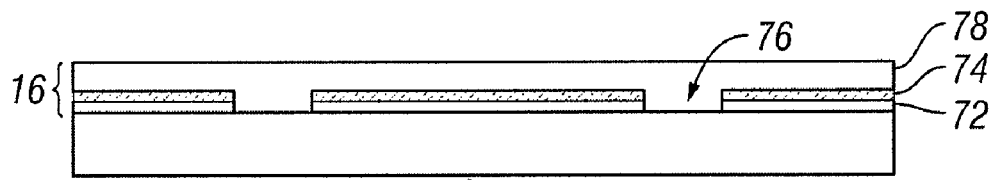

The conductive layer 72 and partially reflective layer 74 may be patterned via photolithography and etched via, for example, commercially available wet etches. Chromium wet etches include solutions of Acetic Acid ($C_2H_4O_2$) and Cerium Ammonium Nitrate [$Ce(NH_4)_2(NO_3)_6$]. ITO wet etches include HCl, a mixture of HCl and $HNO_3$, or a mixture of $FeCl_3$/HCl/DI in a 75%/3%/22% ratio and $H_2O$. Once the apertures 76 have been formed, a dielectric layer 78 is deposited over the conductive and partially reflective layers 72 and 74, as seen in FIG. 9C, forming the optical stack 16. In certain embodiments, the dielectric layer may comprise $SiO_2$ or $SiN_x$, although a wide variety of suitable materials may be used.

The thickness and positioning of the layers forming the optical stack 16 determines the color reflected by the interferometric modulator element when the element is actuated (collapsed), bringing the movable layer 66 into contact with the optical stack. In certain embodiments, the optical stack is configured such that the interferometric modulator element reflects substantially no visible light (appears black) when the movable layer is in an actuated position. Typically, the thickness of the dielectric layer 78 is about 450 Å. While illustrated as planar (which can be achieved if the dielectric layer 78 is a spin-on glass), the dielectric layer 78 is typically conformal over the patterned lower electrode formed from layers 72 and 74.

Figure 9D:
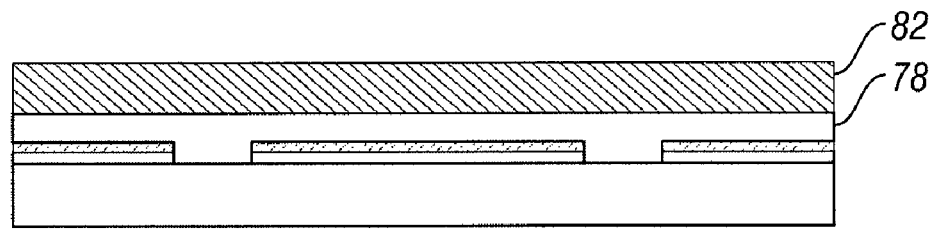

As seen in FIG. 9D, a layer 82 of sacrificial material is then deposited over the dielectric layer 78. In certain embodiments, this sacrificial layer 82 is formed from a material which is etchable by $XeF_2$. For example, the sacrificial layer 82 may be formed from molybdenum or amorphous silicon (a—Si). In other embodiments, the sacrificial layer may comprise tantalum or tungsten. Other materials which are usable as sacrificial materials include silicon nitride, certain oxides, and organic materials. The thickness of the deposited sacrificial layer 82 will determine the distance between the optical stack 16 and the movable layer 66, thus defining the dimensions of the interferometric gap 19 (see FIG. 7A). As the height of the gap 19 determines the color reflected by the interferometric modulator element when in an unactuated position, the thickness of the sacrificial layer 82 will vary depending on the desired characteristics of the interferometric modulator. For instance, in an embodiment in which a modulator element that reflects green in the unactuated position is formed, the thickness of the sacrificial layer 82 may be roughly 2000 Å. In further embodiments, the sacrificial layer may have multiple thicknesses across an array of MEMS devices, such as in a multicolor display system where different interferometric gap sizes are used to produce different colors.

Figure 9E:
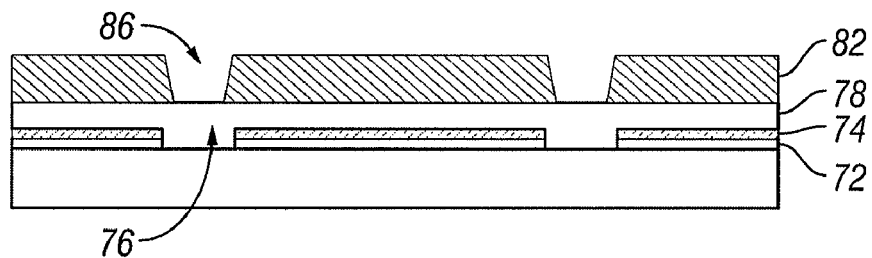

In FIG. 9E, it can be seen that the sacrificial layer 82 has been patterned and etched to form tapered apertures 86. The apertures 86 overlie the apertures 76 cut into the layers 72 and 74 of ITO and chromium. These apertures 86 may be formed by masking the sacrificial layer, using photolithography, and then performing either a wet or dry etch to remove portions of the sacrificial material. Suitable dry etches include, but are not limited to, $SF_6$, $CF_4$, $Cl_2$, or any mixture of these gases with $O_2$ or a noble gas such as He or Ar. Wet etches suitable for etching Mo include a PAN etch, which may be a mix of phosphoric acid, acetic acid, nitric acid and deionized water in a 16:1:1:2 ratio. Amorphous silicon can be etched by wet etches including KOH and HF Nitrate. Preferably, however a dry etch is used to etch the sacrificial layer 82, as dry etches permit more control over the shape of tapered apertures 86.

Figure 9F:
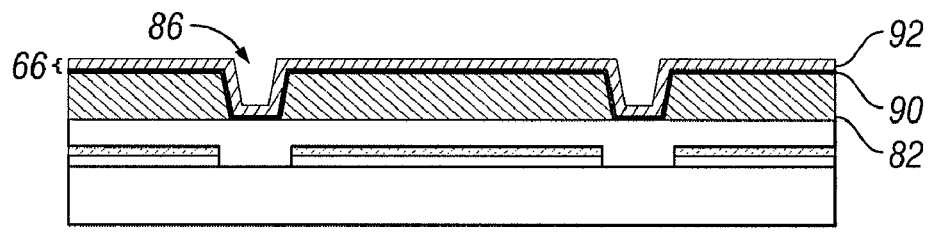

In FIG. 9F, it can be seen that the components which will form the movable layer 66 (see, e.g., moveable reflective layer 14 in FIG. 7A) are then deposited over the etched sacrificial layer 82, lining the tapered apertures 86. In the embodiment of FIG. 9F, a highly reflective layer 90, also referred to as a mirror or mirror layer, is deposited first, followed by a mechanical layer 92. The highly reflective layer 90 may be formed from aluminum or an aluminum alloy, due to their high reflectance over a wide spectrum of wavelengths. The mechanical layer 92 may comprise a metal such as Ni and Cr, and is preferably formed such that the mechanical layer 92 contains residual tensile stress. The residual tensile stress provides the mechanical force which pulls the movable layer 66 away from the optical stack 16 when the modulator is unactuated, or "relaxed." For convenience, the combination of the highly reflective layer 90 and mechanical layer 92 may be collectively referred to as movable layer 66, although it will be understood that the term movable layer, as used herein, also encompasses a partially separated mechanical and reflective layer, such as the mechanical layer 34 and the movable reflective layer 14 of FIG. 7C, the fabrication of which in conduction with support structures is discussed below with respect to FIGS. 35A-35H and 36A-36C.

In an embodiment in which the sacrificial layer is to be etched by a $XeF_2$ etch, both the reflective layer 90 and the mechanical layer 92 are preferably resistant to $XeF_2$ etching. If either of these layers is not resistant an etch stop layer may be used to protect the non-resistant layer. It can also be seen that the taper of the tapered apertures 86 facilitates the conformal deposition of the reflective layer 90 and mechanical layer 92, as they may comprise non-planarizing materials. Absent this taper, it may be difficult to deposit these layers such that the layers have substantially even thicknesses within the apertures 86.

In an alternate embodiment, the movable layer 66 may comprise a single layer which is both highly reflective and has the desired mechanical characteristics. However, the deposition of two distinct layers permits the selection of a highly reflective material, which might otherwise be unsuitable if used as the sole material in a movable layer 66, and similarly allows selection of a suitable mechanical layer without regard to its reflective properties. In yet further embodiments, the movable layer may comprise a reflective sublayer which is largely detached from the mechanical layer, such that the reflective layer may be translated vertically without bending (See, e.g., FIGS. 7C-7E and attendant description). One method of forming such an embodiment comprises the deposition of a reflective layer over the sacrificial layer, which is then patterned to form individual reflective sublayers. A second layer of sacrificial material is then deposited over the reflective layer and patterned to permit the connections to be made through the second sacrificial layer between the mechanical sublayer and the reflective sublayers, as well as to form tapered apertures for the support structures.

In other embodiments in which the MEMS devices being formed comprise non-optical MEMS devices (e.g., a MEMS switch), it will be understood that the movable layer 66 need not comprise a reflective material. For instance, in embodiments in which MEMS devices such as MEMS switches are being formed comprising the support structures discussed herein, the underside of the movable layer 66 need not be reflective, and may advantageously comprise a single layer, selected solely on the basis of its mechanical properties or other desirable properties.

Figure 9G:
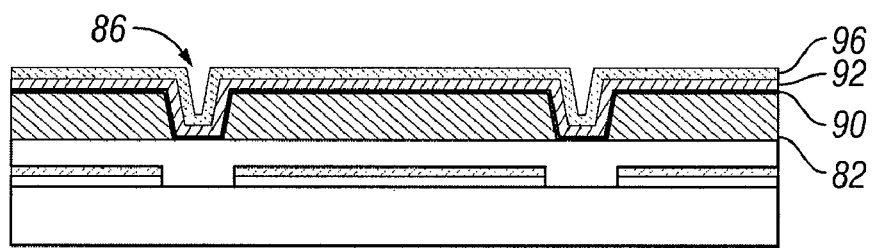

In FIG. 9G, a rigid layer 96, also referred to as a rivet layer, is deposited over the mechanical layer 92. As the rivet layer 96 will form a structure which provides support to the underlying mechanical layer 92 but will not be substantially deformed during actuation of the modulator, the material forming the rivet layer 96 need not be as flexible as that forming the mechanical layer 92. Suitable materials for use in the rivet layer 96 include, but are not limited to, aluminum, $AlO_x$, silicon oxide, $SiN_x$, nickel and chromium. Alternate materials which may be used to form the rivet structure include other metals, ceramics, and polymers. The thickness of the rivet layer 96 will vary according to the mechanical properties of the material used.

As discussed with respect to the mechanical and reflective layers, it may be desirable to select for the rivet layer 96 a material that is resistant to $XeF_2$ etching, which may be used to etch the sacrificial layer in certain embodiments. In addition, the rivet layer 96 is preferably selectively etchable with respect to the underlying mechanical layer 92, so as to permit etching of the rivet layer 96 while leaving the mechanical layer 92 unaffected. However, if the rivet layer 96 is not selectively etchable relative to the mechanical layer 92, an etch stop layer (not shown) may be provided between the rivet layer 96 and the mechanical layer 92.

Figure 9H:
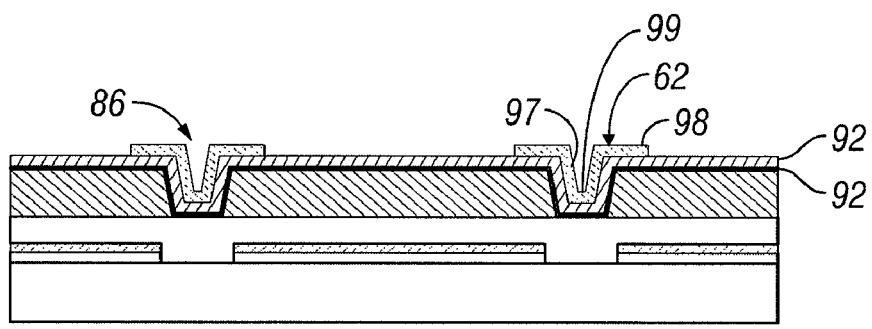

In FIG. 9H, the rivet layer 96 is patterned via photolithography and etched to remove portions of the rivet layer 96 located away from the apertures 86, forming support structures 62, also referred to as rivet structures. The etching of the rivet layer 96 may be performed by either a wet etch or a dry etch. In embodiments in which the rivet layer 96 comprises aluminum, suitable wet etches include phosphoric acid or bases such as KOH, TMAH, and NaOH, and a suitable dry etch uses $Cl_2$. In other embodiments in which the rivet layer 96 comprises $SiO_2$, a mixture of fluorine-bases gases and either $O_2$ or noble gases may be used as a dry etch, and HF or BOE are suitable wet etches.

Referring still to FIG. 9H, it can be seen that the support structures 62 may comprise a lip area 98, where the support structure 62 extends out of the tapered aperture 86 over the upper surface of the mechanical layer 92. Advantageously, the size of this lip can be minimized, as the lip constrains deflection of the underlying mechanical layer, reducing the active area of the interferometric modulator element. As can be seen in the illustrated embodiment, the support structures 62 may also comprise a sloped sidewall portion 97 and a substantially flat base area 99.

Figure 9I:
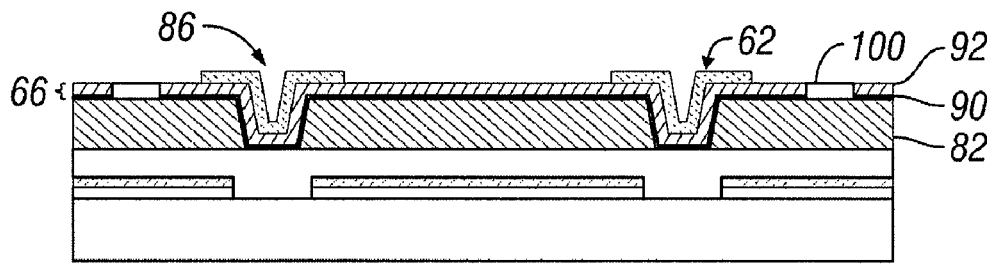

Next, in FIG. 9I, it can be seen that photolithography is used to pattern the mechanical layer 92, and etch the mechanical layer 92 and the reflective layer 90 to form etch holes 100, which expose portions of the sacrificial layer 82, in order to facilitate etching of the sacrificial layer. In certain embodiments, multiple etches are employed to expose the sacrificial layer. For example, if the mechanical layer 92 comprises nickel and the reflective layer 90 comprises aluminum, $HNO_3$ may be used to etch the mechanical layer 92, and phosphoric acid or a base such as $NH_4OH$, KOH, THAM, or NaOH may be used to etch the reflective layer 90. This patterning and etching may also be used to define the strip electrodes seen in FIG. 8, by etching gaps 65 between strips of the movable layer 66 (see FIG. 8), separating columns of MEMS devices from one another.

Figure 9J:
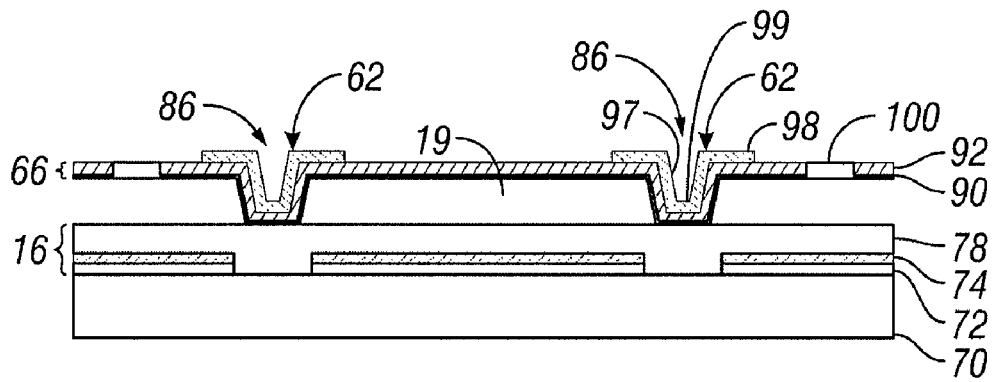

Finally, in FIG. 9J, it can be seen that a release etch is performed to remove the sacrificial layer, creating the interferometric gap 19 through which the movable layer 66 can move. In certain embodiments, a $XeF_2$ etch is used to remove the sacrificial layer 82. Because $XeF_2$ etches the sacrificial materials well, and is extremely selective relative to other materials used in the processes discussed above, the use of a $XeF_2$ etch advantageously permits the removal of the sacrificial material with very little effect on the surrounding structures.

Thus, FIG. 9J depicts a portion of an interferometric modulator element such as one of the interferometric modulator elements 60 of FIG. 8, shown along line 9J-9J. In this embodiment, the movable layer 66 is supported throughout the gap 19 by support structures 62 formed over depressions 86 in the movable layer 66. As discussed above, portions of the underlying optical stack 16 have advantageously been etched so as to prevent shorting between conductive portions of the optical stack 16 and conductive layers in the movable layer 66, although this step need not be performed in all embodiments.

Figure 10:
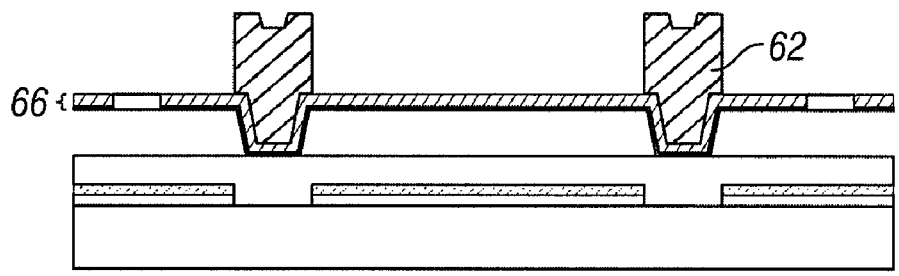
FIG. 10 is a schematic cross-section illustrating an interferometric modulator element fabricated by the method of FIGS. 9A-9J wherein the support structures have been made thicker.

Although the thickness of the rivet layer 96 deposited in FIG. 9G may be determined based upon the mechanical characteristics of the material used, in alternate embodiments, the rivet layer 96 may be made much thicker than merely sufficient for the function of providing support for the mechanical layer. FIG. 10 depicts a portion of an interferometric modulator in which the support structures 62 have been formed from a much thicket rivet layer. Such an embodiment enables the support structures 62 to perform other functions, such as supporting additional components of the modulator (see FIG. 7E and attendant description), providing spacers to protect the interferometric modulator element from damage due to mechanical interference with the movable layer 66, or to support a protective backplate. In certain embodiments the thickness of the rivet layer may be between 300 Å and 1000 Å. In other embodiments, the thickness of the rivet layer may be between 1000 Å and 10 microns. In other embodiments, the thickness of the rivet layer may be 20 microns or higher. In certain embodiments, the thickness of the rivet layer may be between 0.1 and 0.6 times the thickness of the mechanical layer. In other embodiments, the thickness of the rivet layer may be between 0.6 and 1 times the thickness of the mechanical layer. In other embodiments, the thickness of the rivet layer may be between 1 and 200 times the thickness of the mechanical layer. It will be understood that in certain embodiments, thicknesses both within and outside of the above ranges may be appropriate.

In an embodiment in which the movable layer 66 comprises a conductive reflective layer 90, the separate mechanical layer 92 can be omitted, and the rivet layer 96 may serve as the mechanical layer, while the conductive reflective layer 90 may provide the desired electrical connectivity across a MEMS array, serving as the electrodes. In a further embodiment, the conductive reflective layer 90 may be made thicker than is necessary to provide the desired optical characteristics in order to provide better conductive characteristics, such as by lowering the resistivity of the strip electrodes formed from the patterned conductive reflective layer 90.

In another variation, a thick mechanical layer may be deposited after performing the steps described with respect to FIGS. 9A-9E. This thick mechanical layer may subsequently be polished down or otherwise etched back to achieve a desired thickness in those portions overlying the remaining sacrificial layer. However, as the mechanical layer is initially thicker than the desired final thickness in the areas overlying the sacrificial material, a thicker mechanical layer will remain in the apertures in the sacrificial layer, untouched by the polishing, providing support similar to that resulting from the support structures 62 (see, e.g., FIG. 9H), as discussed above. Advantageously, the mechanical layer may be thick enough to totally fill the apertures in the sacrificial layer, although it will be understood that sufficient support may be provided with a thinner mechanical layer in certain embodiments.

Figure 11A:
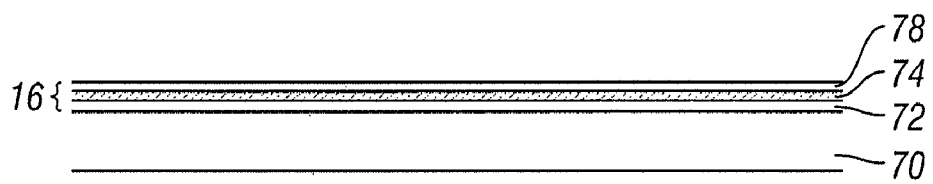
FIGS. 11A-11G are schematic cross sections illustrating certain steps in a process for fabricating an interferometric modulator having inorganic post support structures.

In another embodiment, the support structures may take the form of inorganic posts underlying the movable layer. An exemplary process for fabricating an interferometric modulator comprising inorganic support posts is discussed with respect to FIGS. 11A-11G, the early steps of which process may correspond generally to the early steps in the process of FIGS. 9A-9J. In various embodiments, as discussed above, fabricating an interferometric modulator comprises forming an optical stack on a substrate, which may be a light-transmissive substrate, and in further embodiments is a transparent substrate. The optical stack may comprise a conductive layer, which forms an electrode layer on or adjacent the substrate; a partially reflective layer, which reflects some incident light while permitting some light to reach the other components of the interferometric modulator element; and a dielectric layer, which insulates the underlying electrode layer from the other components of the interferometric modulator. In FIG. 11A, it can be seen that a transparent substrate 70 is provided, and that a conductive layer 72 and a partially reflective layer 74 are deposited over the substrate 70. A dielectric layer 78 is then deposited over the partially reflective layer 74.

As discussed above, in some embodiments, the conductive layer 72 is transparent and comprises ITO, the partially reflective layer 74 comprises a semireflective thickness of metal, such as chromium (Cr), and the dielectric layer 78 comprises silicon oxide ($SiO_2$). At some point during this process, at least the conductive layer 72 is patterned (as shown in FIG. 9B) to form row electrodes which will be used to address a row of interferometric modulators. In one embodiment, this patterning takes place after the deposition of the conductive and partially reflective layers 72 and 74, but prior to the deposition of the dielectric layer 78. In a further embodiment, the conductive and partially reflective layers 72 and 74 are patterned so as to form gaps (not shown) underneath the support structures, so as to minimize the possibility of a short between the layers 72 and 74 and an overlying conductive layer forming part of or extending underneath the support structure.

The combination of the layers 72, 74, and 78 is referred to herein as the optical stack 16, and may be indicated by a single layer in later figures, for convenience. It will be understood that the composition of the optical stack 16 may vary both in the number of layers and the components of those layers, and that the layers discussed above are merely exemplary.

A variety of methods can be used to perform the patterning and etching processes discussed with respect to the various embodiments disclosed herein. The etches used may be either a dry etch or a wet etch, and may be isotropic or anisotropic. Suitable dry etches include, but are not limited to: $SF_6/O_2$, $CHF_3/O_2$, $SF_2/O_2$, $CF_4/O_2$, and $NF_3/O_2$. Generally, these etches are suitable for etching one or more of $SiO_x$, $SiN_x$, $SiO_xN_y$, spin-on glass, Nissan™ hard coat, and $TaO_x$, but other materials may also be etched by this process. Materials which are resistant to one or more of these etches, and may thus be used as etch barrier layers, include but are not limited to Al, Cr, Ni, and $Al_2O_3$. In addition, wet etches including but not limited to PAD etches, BHF, KOH, and phosphoric acid may be utilized in the processes described herein, and may generally be used to etch metallic materials. Generally, these etches may be isotropic, but can be made anisotropic through the use of a reactive ion etch (RIE), by ionizing the etch chemicals and shooting the ions at the substrate. The patterning may comprise the deposition of a photoresist (PR) layer (either positive or negative photoresist), which is then used to form a mask. Alternately, a hard mask can be utilized. In some embodiments, the hard mask may comprise metal or $SiN_x$, but it will be understood that the composition of the hard mask may depend on the underlying materials to be etched and the selectivity of the etch to be used. In The hard mask is typically patterned using a PR layer, which is then removed, and the hard mask is used as a mask to etch an underlying layer. The use of a hard mask may be particularly advantageous when a wet etch is being used, or whenever processing through a mask under conditions that a PR mask cannot handle (such as at high temperatures, or when using an oxygen-based etch). Alternate methods of removing layers may also be utilized, such as an ashing etch or lift-off processes.

Figure 11B:
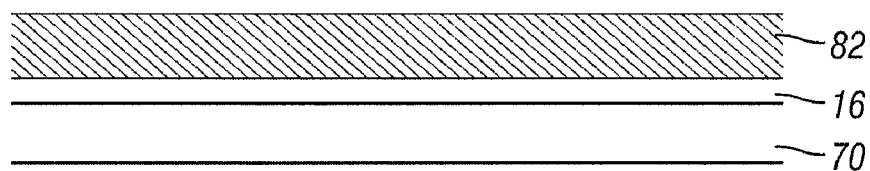
Figure 11C:
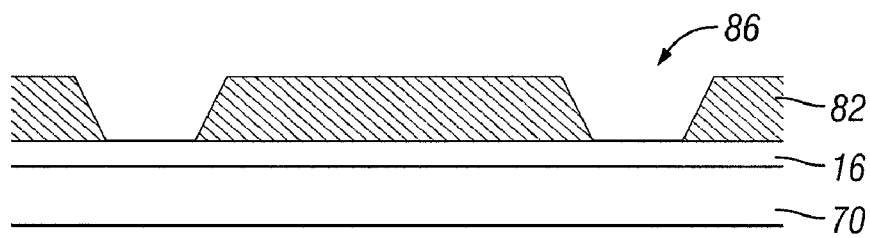

In FIG. 11B, it can be seen that a layer 82 of sacrificial material is deposited over the optical stack 16. In FIG. 11C, the sacrificial layer 82 has been patterned and etched to form tapered apertures 86, which correspond to the locations of post or support regions. These apertures 86 are advantageously tapered in order to facilitate continuous and conformal deposition of overlying layers.

Figure 11D:
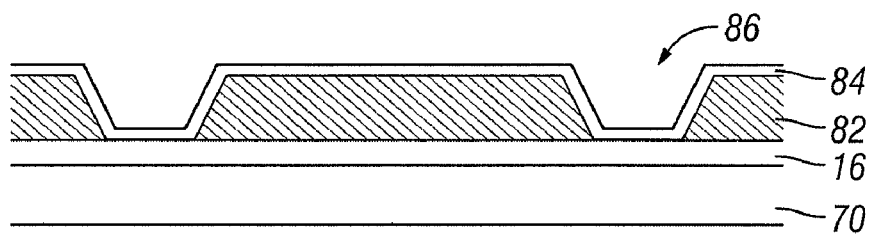
Figure 11E:
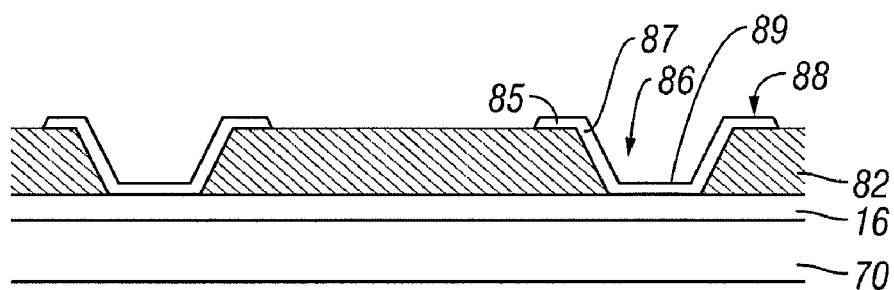

In FIG. 11D, a layer 84 of inorganic post material is deposited over the patterned sacrificial layer 82, such that the inorganic post layer 84 also coats the sidewalls and the base of the tapered apertures 86. In certain embodiments, the inorganic post layer 84 is thinner than the sacrificial layer 82, and is conformal over the sacrificial layer 82. In other embodiments, post layer 84 may have a thickness between 1000 Å and 5000 Å. It will be understood that depending on the embodiment and the materials being used, thicknesses both less than this range and greater than this range are usable. In certain embodiments, the inorganic post layer 84 may comprise silicon nitride ($SiN_x$) or $SiO_2$, although a wide variety of other materials may be used, some of which are discussed in greater detail below. In FIG. 11E, the inorganic post layer 84 is patterned and etched to form inorganic posts 88. It can be seen in FIG. 11E that the edges of the inorganic posts 88 preferably taper which, like the tapered or sloped sidewalls of the apertures 86, facilitate continuous and conformal deposition of overlying layers. It can be seen that the post structure 88 in the illustrated embodiment has a thickness which is thinner than that of the sacrificial layer 82, and comprises a substantially flat base portion 89, a sloped sidewall portion 87, and a substantially horizontal wing portion 85 which extends over a portion of the sacrificial material. Thus, the post 88 advantageously provides a substantially flat surface at the edge of the post for supporting an overlying movable layer 66 (See FIG. 11G), minimizing stress and the resultant undesired deflection which might occur if the movable layer 66 were deposited over a less flat edge.

In one embodiment, the inorganic post layer 84 and resultant post 88 comprise diamond-like carbon (DLC). In addition to being extremely hard and stiff (roughly 10× harder than $SiO_2$), the DLC inorganic post layer 84 can be etched with an $O_2$ dry etch. Advantageously, an $O_2$ dry etch is highly selective relative to a wide variety of sacrificial materials, including but not limited to Mo and a—Si sacrificial material, as well as other sacrificial materials discussed above. An inorganic post comprising DLC thus provides a very stiff post, lessening the likelihood and amount of downward flexure of the edges of the support post 88 when overlying moving or mechanical layers are pulled downward during MEMS operation, while permitting the use of an etch which is relatively benign to a wide variety of materials.

Figure 11F:
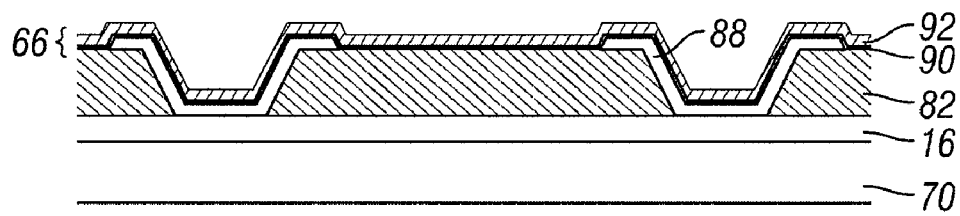
Figure 11G:
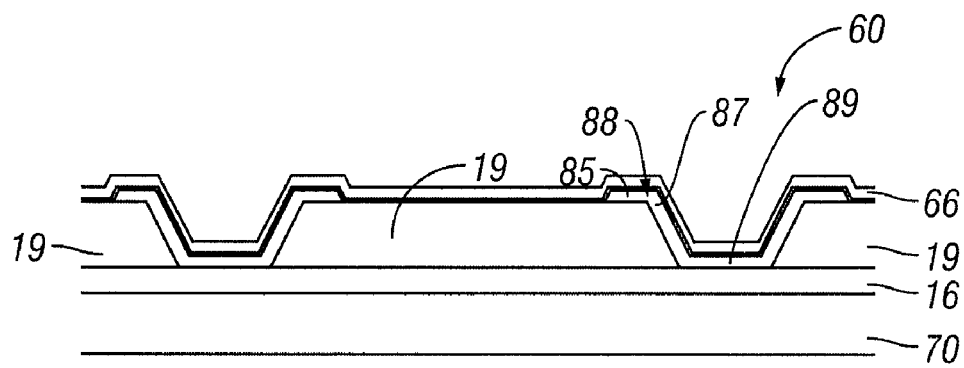

In FIG. 11F, a highly reflective layer 90 is deposited over the inorganic posts 88 and the exposed portions of the sacrificial layer 82. A mechanical layer 92 is then deposited over the highly reflective layer 90. For convenience, as noted above, the highly reflective layer 90 and the mechanical layer 92 may be referred to and depicted in subsequent figures as a movable layer 66 (see FIG. 11G), or more particularly as a deformable reflective layer whenever the mechanical layer 92 is deposited directly over the highly reflective layer 90. In alternate embodiments, the movable layer 66 may comprise a single layer which has the desired optical and mechanical properties. For example, mechanical or moving layers for MEMS mechanical switches need not include reflective layers. In still further embodiments, as already discussed, the movable layer may comprise a mechanical layer and a reflective layer which are substantially separated, such as layers 14 and 34 of FIG. 7C. An exemplary process for forming such a MEMS device having partially separated mechanical and reflective layers is discussed in greater detail below with respect to FIGS. 35A-35H and 36A-36C. In FIG. 11G, a release etch is performed to selectively remove the sacrificial layer 82, forming an interferometric modulator element 60 having an interferometric gap 19 through which the movable layer 66 can be moved in order to change the color reflected by the interferometric modulator element 60. Prior to the release etch, the movable layer 66 is preferably patterned to form columns (not shown), and may advantageously be further patterned to form etch holes (see, e.g., etch holes 100 in FIG. 9J) which facilitate access to the sacrificial layer by the release etch.

In an alternate embodiment (as described below with respect to FIG. 17), the reflective layer may be deposited prior to the deposition and etching of the support layer 84, such that the reflective layer will underlie the support structure 88 in the finished modulator element.

Figure 12A:
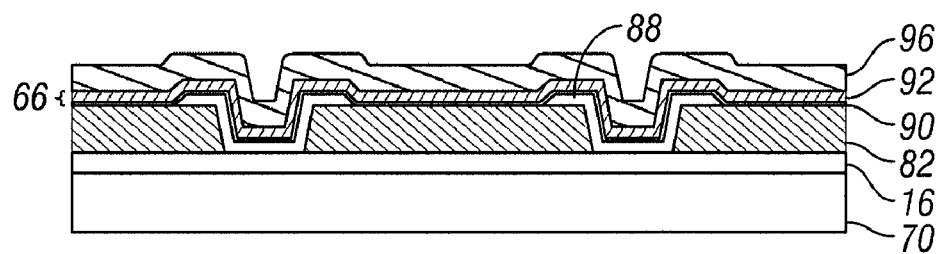
FIGS. 12A-12D are schematic cross-sections illustrating a method for fabricating an interferometric modulator element comprising support structures located both above and underneath the movable layer.

In yet another embodiment, support structures may be formed both above and below the movable layer 66. FIGS. 12A-12D depict such an embodiment, which includes the steps of FIGS. 11A-11F. In FIG. 12A, it can be seen that once the reflective layer 90 and the mechanical layer 92 have been deposited over the underlying support structure 88, a rivet layer 96 is deposited over the mechanical layer 92.

Figure 12B:
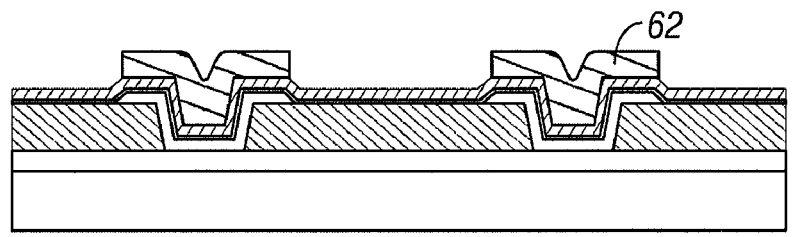
Figure 12C:
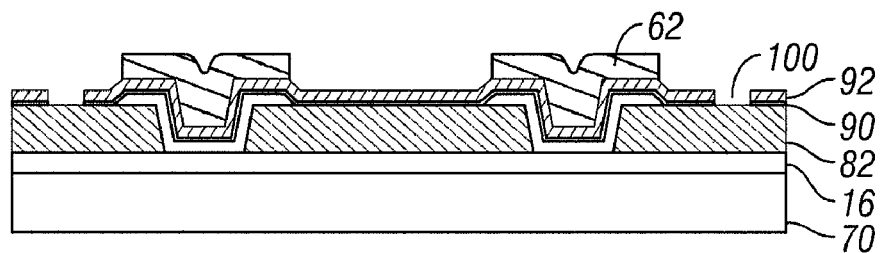

Subsequently, as seen in FIG. 12B, the rivet layer 96 is patterned and etched to form support structures 62 located above the mechanical layer 92. In certain embodiments, the same mask used in the steps of FIG. 11E to pattern the underlying support structures 88 may be used to pattern the overlying support structures 62. FIG. 12C depicts the patterning and etching of the mechanical layer 92 and the reflective layer 90 to form etch holes 100 in those layers, exposing the sacrificial layer 82.

Figure 12D:
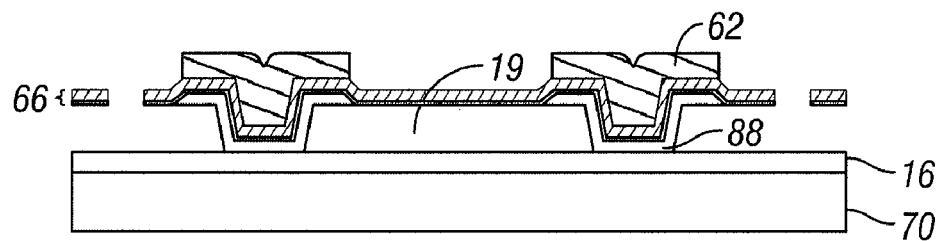

Finally, as shown in FIG. 12D, the sacrificial layer 82 is etched to remove the sacrificial material and release the interferometric modulator, permitting movement of movable layer 66 through the interferometric gap 19. Thus, an interferometric modulator display element has been formed, wherein support structures 62 and 88 sandwich portions of the movable layer 66 in the depression originally defined by the aperture 86 (FIG. 11C), providing additional support and rigidity, and in certain embodiments, permitting the use of the upper support structures 62 for other purposes (e.g., see FIG. 7E and attendant description), as discussed above.

Figure 13A:
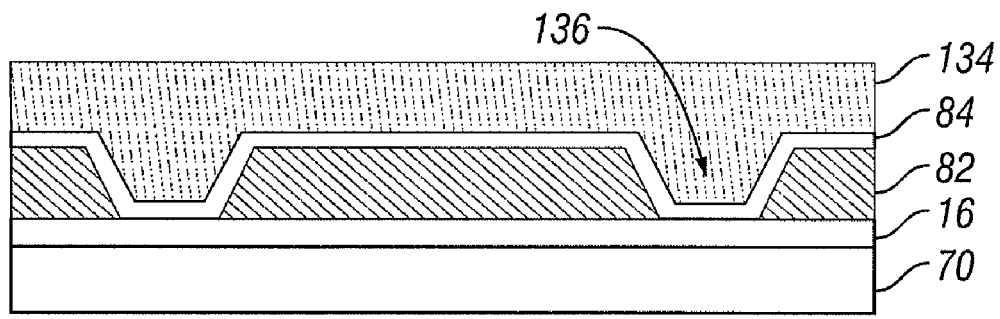
FIGS. 13A-13E are schematic cross-sections illustrating a method for fabricating an interferometric modulator wherein a portion of a photoresist mask is utilized to form a substantially planar surface on which a movable layer is fabricated.

In other embodiments, it may be desirable to provide an underlying rigid support structure having a substantially flat upper surface. One process for fabricating one such embodiment of an interferometric modulator is described with respect to FIGS. 13A-13E. This process includes the steps of FIGS. 11A-11D. In FIG. 13A, it can be seen that a layer of photoresist material 134 is deposited over the layer of rigid support material 84 in order to form a mask, which will be used to etch the support material 84 to form support structures 88, as discussed above with respect to FIG. 11D. It can be seen that the deposited photoresist material 134 is thick enough to extend above the level of the rigid support layer 84, completely filling depressions 136 in the support layer 84 corresponding to the underlying tapered apertures 86 (FIG. 11B).

Figure 13B:
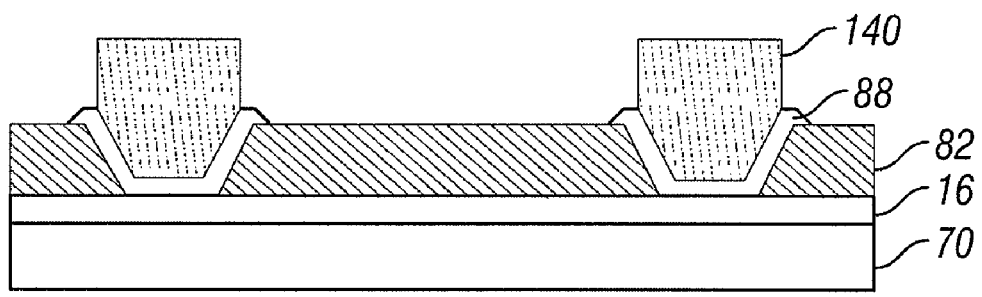
Figure 13C:
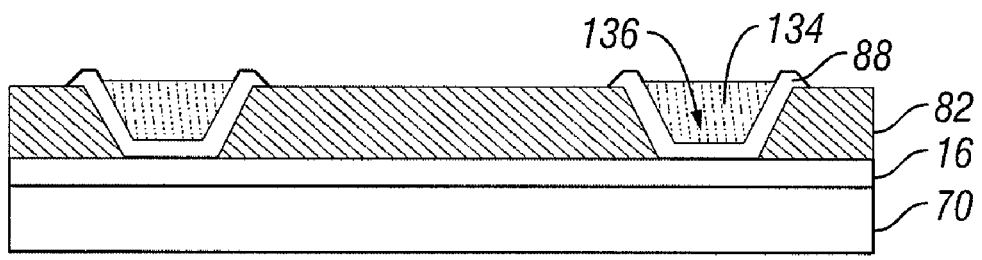
Figure 13D:
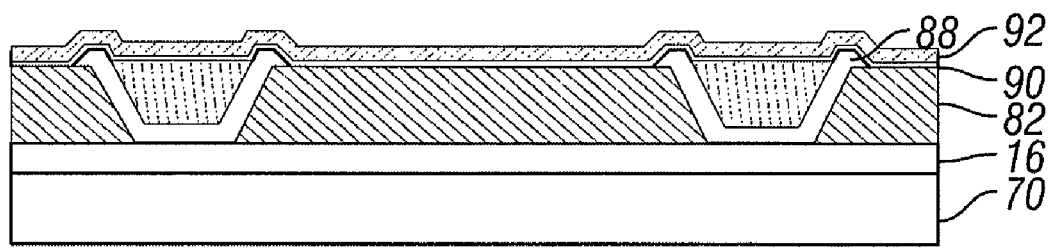
Figure 13E:
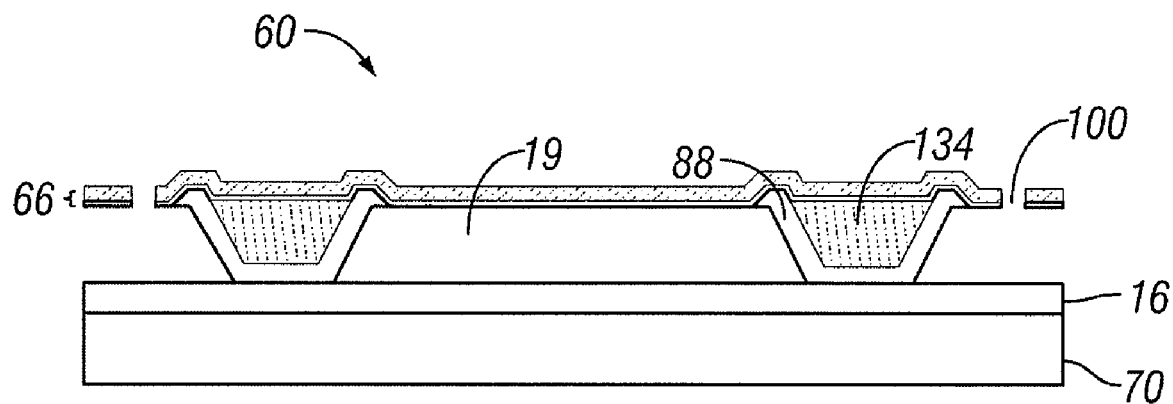

In FIG. 13B, the photoresist material 134 has been patterned to form a mask 140, and the mask has been used to etch the underlying rigid support layer 84, forming support structures 88. In FIG. 13C, the photoresist material of the mask has been etched back such that the remaining photoresist material 134 is located within the depressions 136 in the support structures 88. In FIG. 13D, a reflective layer 90 and a mechanical layer 92 are deposited over the top of the support structures 88, including the remaining photoresist material 134, forming a movable layer 66. As can be seen, the use of the remaining photoresist material 134 forms a substantially flat or planar surface on which the components of the movable layer 66 may be deposited, as compared to the embodiment shown in FIG. 11G. The rigidity of the support structures is also increased by the additional material within the depression. In FIG. 13E, etch holes 100 have been formed in the movable layer 66, and a release etch has been performed to remove the sacrificial layer 82, thereby releasing the interferometric modulator element 60.

In alternate embodiments, the photoresist mask used to form the support structures 88 may be completely removed, and a filler material filling the cavities 136 of the support structures 88 may be deposited in a separate step, which may have the advantage of providing a stiffer rivet material, such as spin-on dielectric. In such an embodiment, any suitable material may be utilized, including but not limited to planarization materials discussed above. However, the process discussed with respect to FIGS. 13A-13E advantageously minimizes the steps required to fabricate such a modulator element by eliminating the separate deposition of an additional layer. In yet further embodiments, a rigid support structure similar to the rigid support structures 62 of FIG. 9J and other embodiments may additionally be formed over the movable layer 66 of FIG. 13E, in order to provide additional support.

Figure 14A:
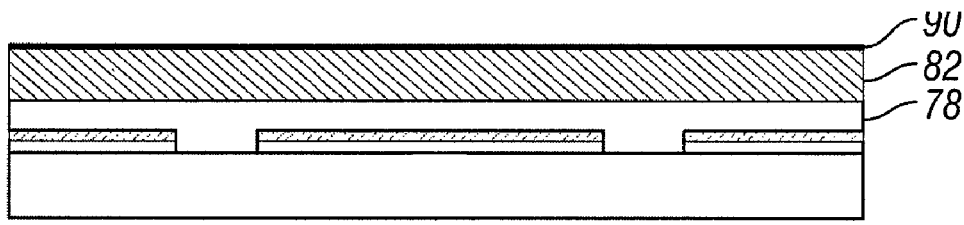
FIGS. 14A-14C are schematic cross-sections illustrating steps which may be performed to selectively remove portions of a reflective layer prior to forming movable and support structures.
Figure 14B:
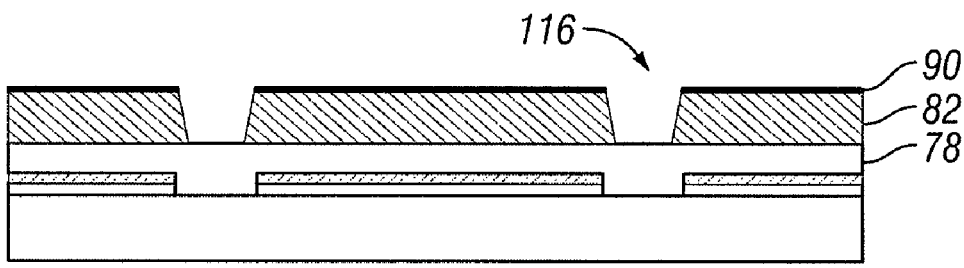
Figure 14C:
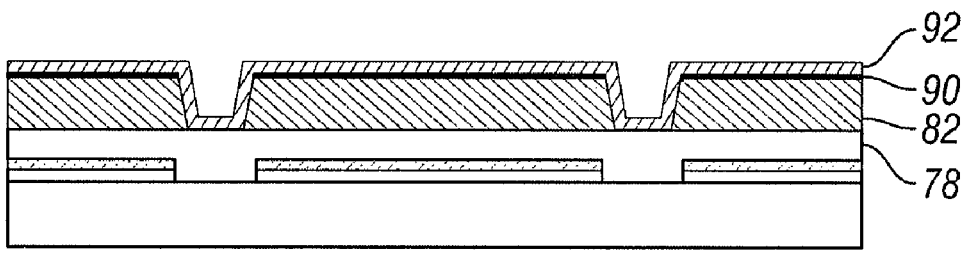

FIGS. 14A-14C illustrate one set of alternative steps which may be performed to ensure that the reflective layer 90 will not underlie the base of the support structure. These steps may be performed, for example, after the steps of FIG. 9A-9D. In FIG. 14A, it can be seen that a reflective layer 90 is deposited over the unetched sacrificial layer 82. In FIG. 14B, it can be see that both the reflective layer 90 and the underlying sacrificial layer 82 have been patterned and etched to form tapered apertures 116. In FIG. 14C, a mechanical layer 92 is deposited over the etched sacrificial and reflective layers 82 and 90. Unlike the tapered apertures 86 of FIG. 9E, it can be seen that the side walls of the tapered apertures 116 will not be coated with the reflective layer 90 (see FIG. 9F), but are rather coated with the mechanical layer 92, such that the mechanical layer 92 is in contact with the underlying dielectric layer 78. It will be understood that an interferometric modulator element may be fabricated by, in one embodiment, subsequently performing the steps described with respect to FIGS. 9G-9J, including formation of a rivet structure.

Figure 15A:
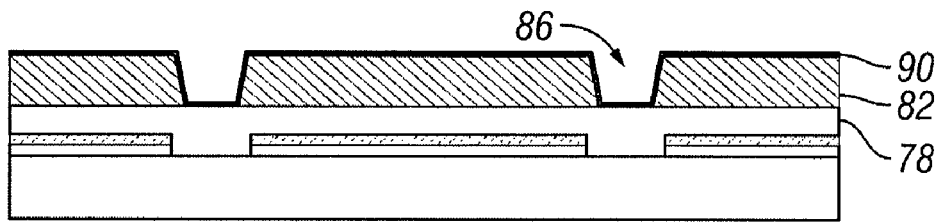
FIGS. 15A-15C are schematic cross-sections illustrating alternative steps which may be performed to selectively remove portions of a reflective layer prior to forming movable and support structures.
Figure 15B:
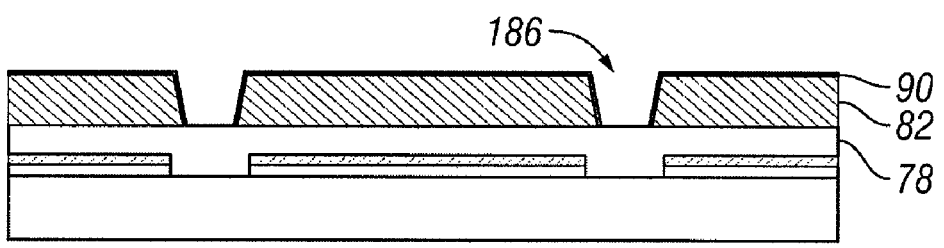
Figure 15C:
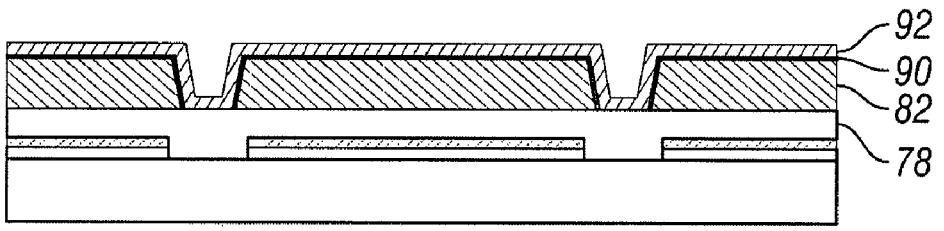

FIGS. 15A-15C illustrate another series of alternative steps which may be used to eliminate those portions of the reflective layer which will underlie the base of the support structure to be formed. These steps may be performed after the steps of FIGS. 9A-9E. Once the sacrificial layer 82 has been patterned and etched to form tapered apertures 86, a reflective layer 90 is deposited over the sacrificial layer 82, as shown in FIG. 15A. In FIG. 15B, the reflective layer 90 is patterned and etched to remove at least the portions of the reflective layer that are in contact with the underlying dielectric layer 78. In further embodiments, the portions of the reflective layer 90 in contact with the side walls of the tapered aperture 86 may also be removed. In FIG. 15C, it can be seen that a mechanical layer 92 is deposited over the etched sacrificial and reflective layers 82 and 90. Subsequently, the steps described with respect to FIGS. 9G-9J may be performed in order to fabricate an interferometric modulator element including a rivet structure.

Figure 16A:
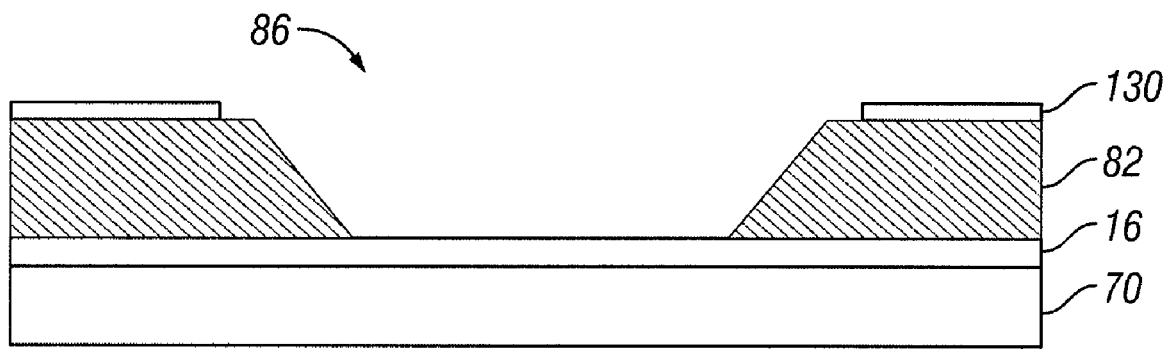
FIGS. 16A-16B are schematic cross sections illustrating certain steps in a process for fabricating an interferometric modulator having an etch barrier layer which protects the sacrificial material from an etching process which forms inorganic posts.
Figure 16B:
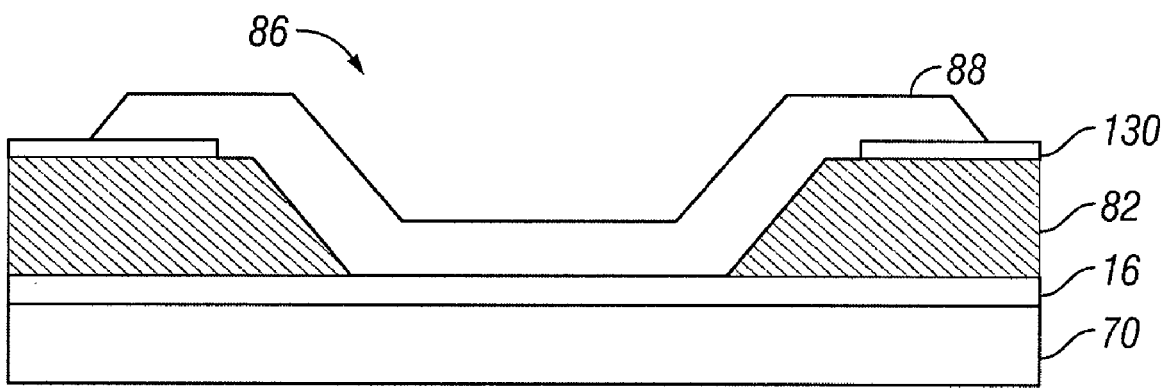

With reference to FIG. 16A, in certain embodiments comprising a post structure, an etch barrier layer 130 is provided which protects the sacrificial layer 82 during the etching of the inorganic post layer 84 (see FIG. 11D) to form the inorganic posts 88 (See FIG. 16B). In the illustrated embodiment, the etch barrier layer 130 is deposited over the sacrificial layer 82 prior to patterning and etching to form the tapered apertures 86 (e.g., between the steps of FIG. 9D and FIG. 9E). The etch barrier layer 130 is then patterned and etched either prior to or at the same time as the forming of the tapered apertures 86 (e.g., may be deposited and patterned in the same manner as the reflective layer of FIGS. 14A-14C). As can be seen in FIG. 16A, the etch barrier layer 130 covers only the portion of the sacrificial layer 82 away from the tapered aperture 86. Advantageously, patterning and etching the etch barrier layer 130 separately from (e.g., prior to) etching the sacrificial layer 82 permits greater control over the etching of the etch barrier 130, preventing the barrier 130 from overhanging the aperture 86 due to the aperture etch undercutting the etch barrier 130. Such an undercut would negatively affect the continuous and conformal deposition of the post layer 84 (see FIG. 11D). Examples of suitable etch barriers include, but are not limited to, Al, Al$_2$O$_3$, Cr, and Ni. In certain embodiments, as discussed in greater detail below with respect to FIGS. 17A-17B, a reflective layer may advantageously serve as an etch barrier layer 130.

The inorganic post layer is then deposited, and etched to form the inorganic posts 88, as seen in FIG. 16B. As can be seen, the sacrificial layer 82 has not been exposed to the etching process which forms the posts, as the mask used to protect the inorganic post layer 84 and define the post structures 88 during the etching process protects the post layer overlying the tapered aperture 86, and the etch barrier layer 130, which now extends between the inorganic posts 88, protect those portions of the sacrificial layer 82. Because of the etch barrier 130, an etch can be used to form the support post 88 which is nonselective between the inorganic post and the sacrificial layer. This is particularly advantageous with respect to dry etches, such as etches involving chemistries such as SF$_6$/O$_2$, CHF$_3$/O$_2$, CF$_4$/O$_2$, NF$_3$/O$_2$ and all other fluorine-containing chemistry, but is also useful with respect to wet etches. As discussed in greater detail, below, in certain embodiments the etch barrier layer 130 may advantageously remain in the finished device.

Figure 17A:
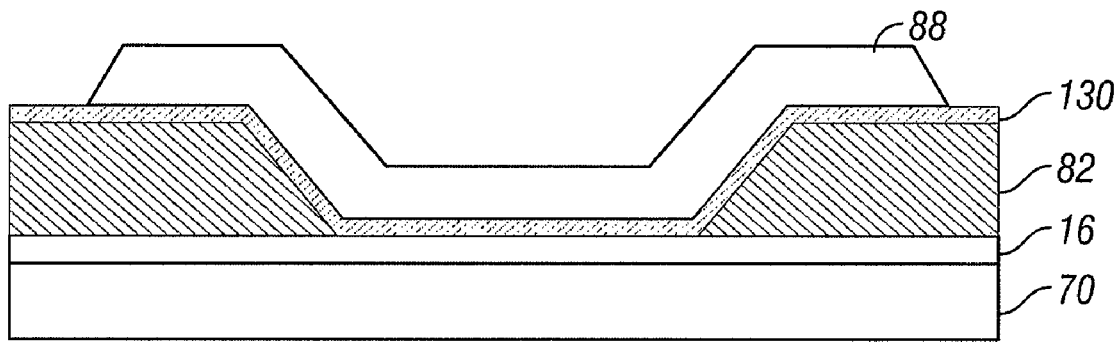
FIGS. 17A-17B are schematic cross sections illustrating certain steps in the fabrication of an interferometric modulator having an etch barrier layer which isolates inorganic posts from sacrificial material.
Figure 17B:
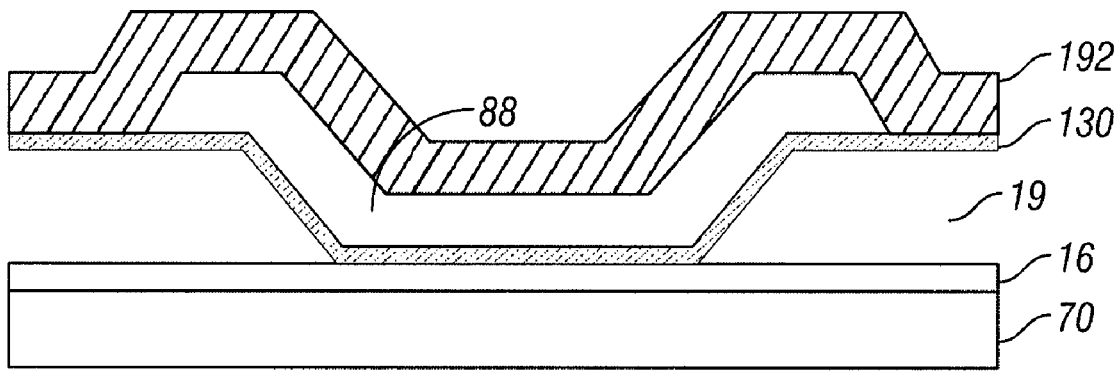

With reference to FIGS. 17A and 17B, in an alternate embodiment, an etch barrier layer 130 is deposited after the sacrificial layer 82 has been patterned and etched to form the tapered apertures 86, such that it coats the walls and base of the tapered apertures 86. The inorganic post layer is then deposited above the etch barrier layer 130 and patterned and etched to form posts 88, as depicted in FIG. 17A. As can be seen in FIGS. 17A and 17B, this etch barrier layer 130 underlies the entire inorganic post 88, in addition to protecting the sacrificial layer 82 not covered by the inorganic post 88.

As can be seen in FIG. 17B, which depicts the modulator section of FIG. 17A after the release etch has been performed, the upper portion of the inorganic post 88 is protected by the mechanical layer 92 deposited over the inorganic post 88. Thus, the inorganic post 88 is completely enclosed by the combination of the etch barrier layer 130 and the mechanical layer 92 during the release etch. Because it is completely enclosed, etch chemistries which are nonselective with respect to the inorganic post material and the sacrificial material may be used in both the inorganic post etch and the release etch. In a particular embodiment, the same material may be used as both the sacrificial material 82 and the inorganic post material which forms post 88, due to the isolation of each layer from the etch performed on the other layer.

In the embodiment depicted in FIG. 17B, that portion of the etch barrier layer 130 which extends beyond the patterned inorganic post 88 may remain in the finished interferometric modulator, or may be removed at some point during the fabrication process, as described with respect to FIGS. 18 and 19, below. In one embodiment, the etch barrier layer 130 may comprise aluminum or another highly reflective material capable of serving as an etch barrier layer. In this embodiment, the etch barrier layer 130 may be left in the finished modulator to serve as the reflective surface in a deformable reflective layer. In such an embodiment, only the mechanical layer 92 need be deposited over the inorganic post 88 and the etch barrier layer 130, as the reflective material comprising the etch barrier layer 130 will deform along with the mechanical layer 92. In another embodiment, the etch barrier layer may comprise a substantially transparent material, such as a thin layer of Al$_2$O$_3$. In interferometric modulators or other optical MEMS elements of this type, an additional reflective layer (not shown), is preferably deposited prior to deposition of the mechanical layer 92, in order to form a deformable reflective layer such as movable layer 66 of FIG. 11G.

In one particular embodiment, the etch barrier layer 130 comprises Al, and is resistant to a fluorine-based etch. In another embodiment, which is particularly suitable for use when the sacrificial layer comprises a—Si, rather than Mo, the etch barrier layer comprises Al or Al$_2$O$_3$, and may alternately comprise Ti or W. Other suitable etch barrier materials include, but are not limited to, Cr and Ni. In one embodiment, the etch barrier layer is between 40 and 500 Angstroms, but may be either thicker or thinner, depending on the embodiment. In an embodiment in which the etch barrier layer 130 comprises a conductive material, removal of the conductive layers within the optical stack 16 in the area directly underlying the support structure 88 advantageously minimizes the risk of a short between the conductive etch barrier layer and the conductive layers within the optical stack 16 (see, e.g., FIG. 9B and attendant description).

Figure 18:
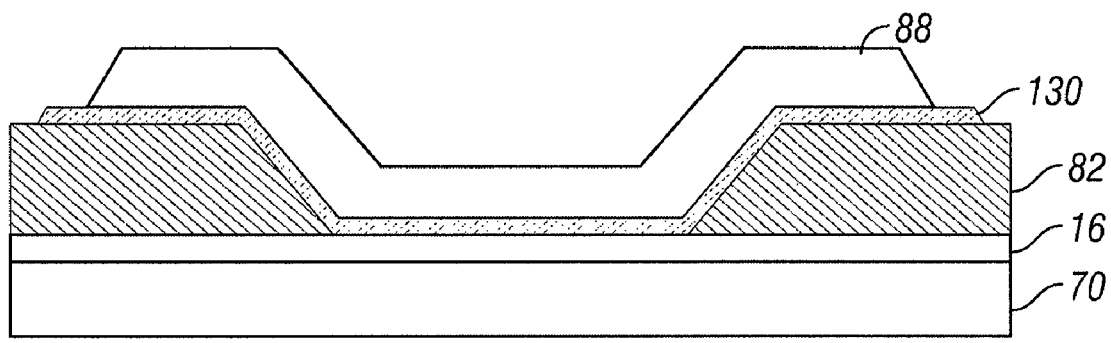
FIG. 18 is a schematic cross section illustrating a partially fabricated interferometric modulator wherein an etch barrier layer, which isolates inorganic posts from sacrificial material, is partially removed.

In an alternate embodiment, described with respect to FIG. 18, an etch barrier layer 130 may be deposited, and an overlying post structure 88 formed, as described with respect to FIG. 17A. After the overlying post structure 88 is formed, a patterning and etching process may be used to remove those portions of the etch barrier layer 130 located away from the post structure 88, such that the remaining portions of the etch barrier layer 130 remain underneath the post structure 88, protecting it from the subsequent release etch. Advantageously, because the portions of the etch barrier layer not underlying or very close to the support post have been removed, the optically active portions of the display are substantially unaffected by the etch barrier layer. Thus, the composition and thickness of the etch barrier layer may be selected purely on the basis of the desired level of protection from the release etch, without regard for the opacity of the etch barrier layer.

Figure 19:
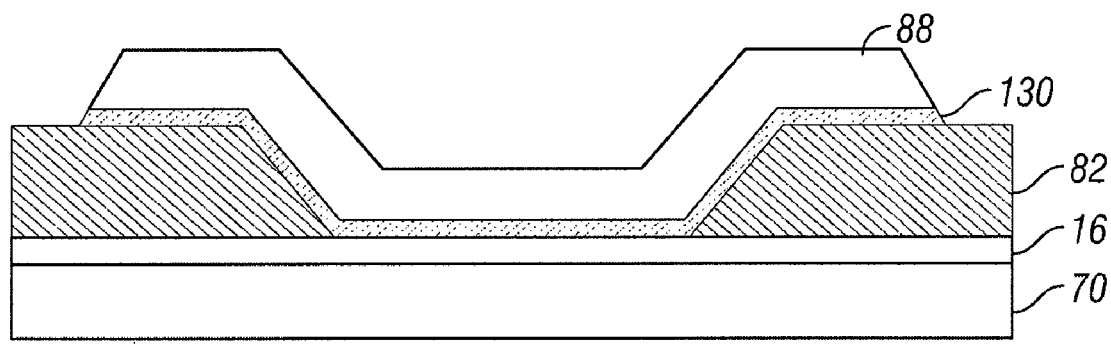
FIG. 19 is a schematic cross section illustrating a partially fabricated interferometric modulator wherein a post structure is used as a hard mask to remove a portion of an etch barrier layer.

In a further refinement of the above process, described with respect to FIG. 19, it can be seen that depending on the composition of the post structure 88, the exposed portions of the etch barrier layer 130 may be etched without the need for an additional patterning process, using the post structure 88 itself as a hard mask during the etching of the etch barrier layer 130. Advantageously, the remaining portion of the etch barrier layer 130 is substantially flush with the edge of the post structure 88, such that no more of the etch barrier layer 130 is left than is necessary to protect the post structure 88 from the release etch, even further minimizing optical effects of the etch stop 130.

Figure 20:
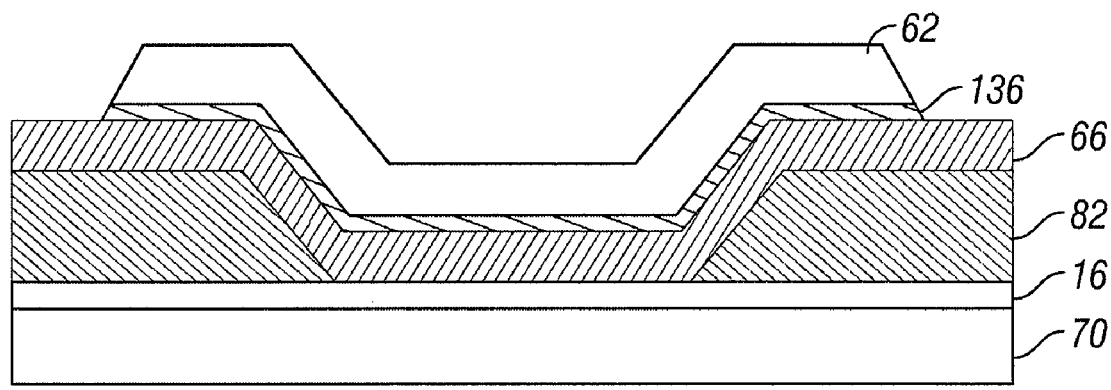
FIG. 20 is a schematic cross section illustrating a step in the fabrication of an interferometric modulator in which an adhesion layer secures a support structure to a movable layer.

With respect to FIG. 20, in an embodiment in which a support structure is formed adjacent to a movable layer 66, such as the illustrated rivet structure 62 overlying the movable layer 66, it may be desirable to provide for additional adhesion to secure the support structure 62 to the movable layer. In particular, because the actuation of the interferometric modulator will tend to pull the movable layer 66 in a direction away from the overlying support structure 62, improved adhesion between the movable layer 66 and the overlying support structure 62 will minimize the risk that the movable layer 66 will begin to pull away from the rivet 62. In the illustrated embodiment, after the deposition of the mechanical layer 92 (see FIG. 9F), an adhesion enhancement layer 136 may be deposited. As shown, the adhesion enhancement layer 136 has been deposited after deposition of the mechanical layer and prior to patterning of the rivet layer, which are simultaneously patterned to form the rivet structure 62.

In another embodiment in which support structures such as post structures 88 of FIG. 11E are formed prior to deposition of the movable layer, an adhesion enhancement layer may be formed over the post layer 84 (see FIG. 11D) prior to patterning the post layer 84 to form support posts 88 (see FIG. 11E). However, it will be understood that the adhesion enhancement layer may alternately be deposited and patterned after the formation of support structure 88, such that the adhesion enhancement layer overlies the tapered edges of the support post 88, enhancing the efficacy of the adhesion enhancement layer but adding to the complexity of the process by adding separate mask and etch steps.

These adhesion enhancement layers may comprise any of a wide variety of materials based on the composition of the movable layer and the layers forming the support structures, as certain materials may provide different amounts of adhesion enhancement when in contact with different materials. One example of an adhesion enhancement material which is useful in conjunction with a wide variety of mechanical and rivet materials is Cr, but many other materials may be used as adhesion enhancement layers.

As discussed above, modifications may be made to a fabrication process in order to protect a deposited rivet structure from the release etch. Advantageously, this both permits the use of a wider range of materials in the rivet structure, as the sacrificial material need not be selectively etchable relative to the rivet material if the rivet material is not exposed to the release etch, and minimizes any damage which might be caused to the rivet structure if it was exposed to the release etch.

Figure 21:
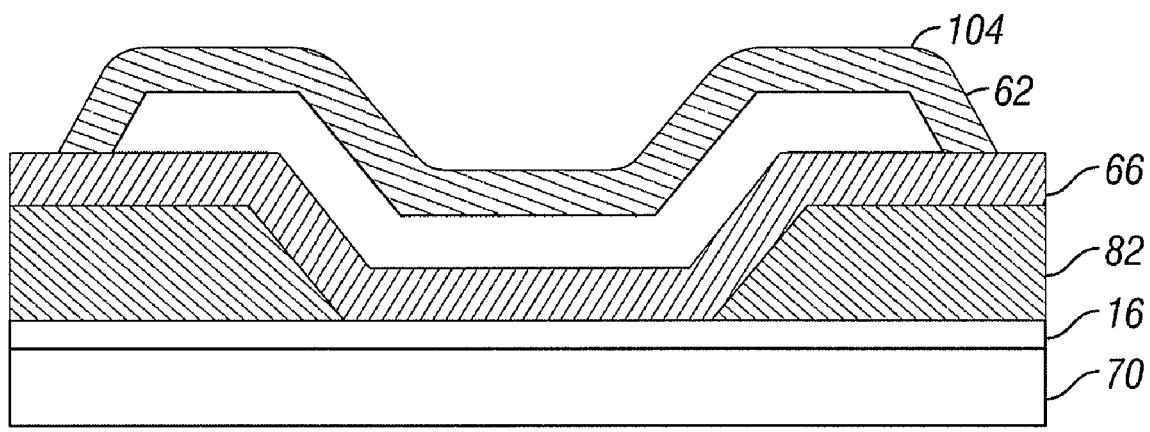
FIG. 21 is a schematic cross section illustrating a step in the fabrication of an interferometric modulator in which a protective layer isolates a rivet structure.

In one embodiment, described with respect to FIG. 21, it can be seen that a rivet structure 62 has been formed over a mechanical or moving layer, which in the illustrated embodiment is a reflective movable layer 66, which extends over a patterned sacrificial layer 82. The rivet 62 is then covered with a protective layer 104, which will remain over the rivet 62 at least until the release etch has been performed, at which point it may or may not be removed. In one embodiment, the protective layer 104 comprises a layer of photoresist material. In another embodiment, a distinct layer of an alternate etch barrier material forms the protective layer 104. The protective layer 104 may be any material sufficiently resistant to the release etch to provide the desired level of protection for the rivet. In one embodiment, for example, the rivet 62 may comprise $SiN_x$, the release etch may be a $XeF_2$ etch, and the protective layer 104 may comprise a layer of photoresist material deposited after the rivet 104 has been formed.

Figure 22:
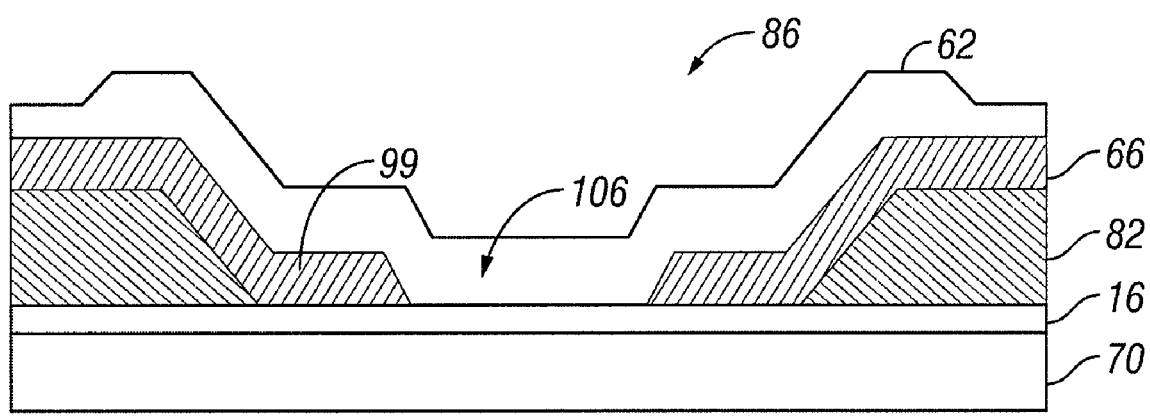
FIG. 22 is a schematic cross section illustrating a step in the fabrication of an interferometric modulator in which a rivet structure is directly secured to an underlying optical stack.

In another embodiment, the stability of a rivet structure may be increased through the securing or anchoring of the rivet structure to structures underlying the mechanical layer or the deformable reflective layer. In one embodiment, depicted in FIG. 22, the movable layer 66 (which may comprise a mechanical layer 92 and a reflective layer 90, see FIG. 9J) is deposited over the patterned sacrificial layer 82 such that it takes the shape of the tapered apertures 86. The movable layer 66 is then etched at least a portion of the base of the tapered aperture 86 so as to expose an underlying layer, which in this case is the dielectric layer at the top of the optical stack 16. The rivet layer is then deposited as discussed above and patterned to form the rivet structure 62. As can be seen, the rivet structure 62 now extends through an aperture 106 extending through the substantially flat base portion 99 of the movable layer 66, securing the rivet structure 62 to the underlying optical stack 16, advantageously providing additional stability to the rivet structure, both because the adhesion of the rivet material to the underlying dielectric layer may be better than the adhesion to the mechanical layer 92 and because the rivet structure 62 no longer relies on the adhesion between the movable layer 66 and the optical stack 16 to hold the rivet structure 62 in place. It will also be understood that in alternate embodiments, the rivet structure 62 may be secured to a structure other than the upper surface of optical stack 16. For instance, in an alternate embodiment (not shown) in which the rivet structure 62 and a post structure underlying the movable layer 66 sandwich a portion of the movable layer 66, the rivet structure can be secured to the underlying post structure through an aperture in the movable layer 66, or to any underlying layer with better adhesion, such as, in certain embodiments, the reflective layer 90 of the movable layer 66.

Figure 23A:
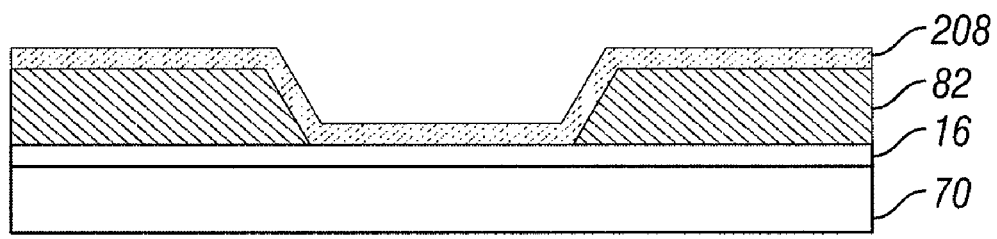
FIGS. 23A-23E are schematic cross sections illustrating certain steps in the fabrication of an interferometric modulator in which plating is used to form an inorganic post.
Figure 23B:
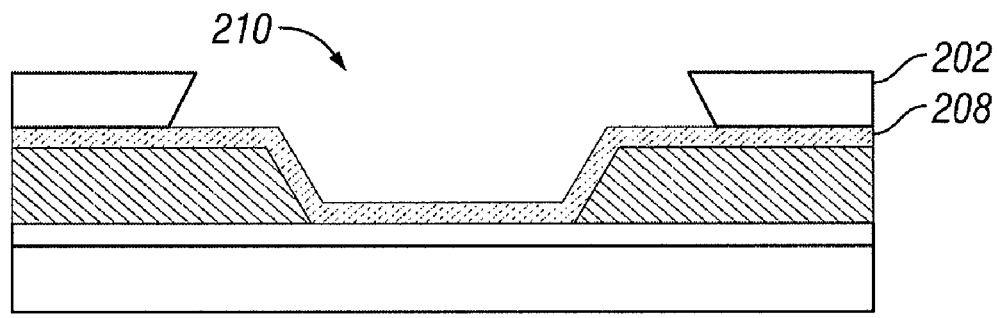
Figure 23C:
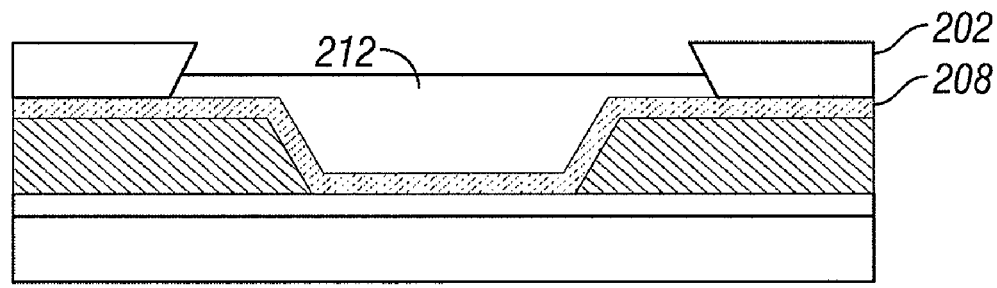
Figure 23D:
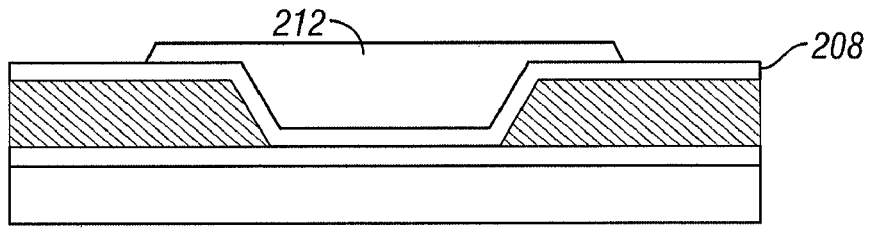
Figure 23E:
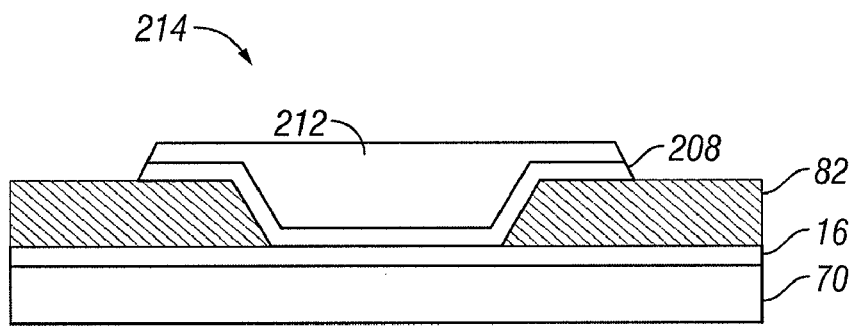

In another process, described with respect to FIGS. 23A-23E, a plating process can be used to form inorganic post structures. This process includes the steps of FIGS. 9A-9E. In FIG. 23A, it can be seen that a thin seed layer 208 is deposited over the patterned sacrificial layer 82. In one embodiment, the seed layer 208 comprises a thin layer of copper and can be formed by sputtering or CVD. In another embodiment, the seed layer may comprise aluminum, and may serve as the reflective layer in an optical MEMS device by omitting the removal step described below with respect to FIG. 23E. In FIG. 23B, a mask 202 is formed over the seed layer 208, having an aperture 210 which defines the shape of the post to be formed by the plating process. It can be seen that the edges of the illustrated aperture 210 have a reentrant profile or overhang (also referred to herein as a negative angle), such that the post structure to be formed will have a taper which corresponds to the tapered edges of the aperture 210. In FIG. 23C, it can be seen that a plating process is used to form a layer 212 of post material. In FIG. 23D, the mask 202 is removed, leaving only the seed layer 208 and the post layer 212. Next, in FIG. 23E, the portions of the seed layer 208 located away from the post layer 212 are etched away (e.g., using the post layer 212 as a mask for this etch), forming an inorganic post 214 comprising the remaining portions of the seed layer 208 and the post layer 212. Subsequently, a mechanical or deformable reflective layer can be deposited over the post, which is facilitated by the tapered angle at edge of the post wings. As discussed above, in an embodiment in which the seed layer comprises aluminum or another reflective material, the removal step of FIG. 23E may be omitted from the process, and a mechanical layer may be deposited over the reflective seed layer.

Figure 24A:
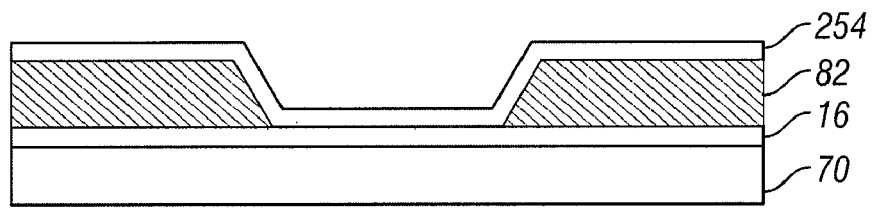
FIGS. 24A-24B are schematic cross sections illustrating certain steps in the fabrication of an interferometric modulator having support posts formed from an anodized material.
Figure 24B:
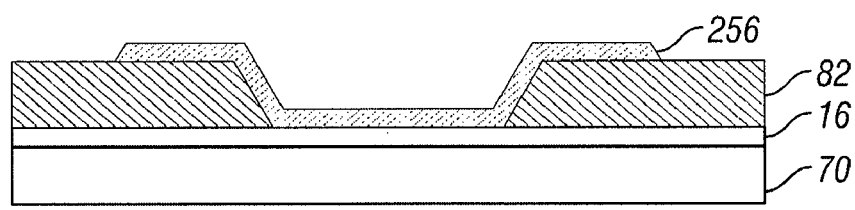

Metal which has been anodized to form metal oxide can also be used to form support structures. In one embodiment, discussed with respect to FIGS. 24A-24B, anodized aluminum or Ta is utilized in the formation of an inorganic post. In FIG. 24A, it can be seen that a metallic layer 254, which may be Al or Ta, is formed over a patterned sacrificial layer 82. In FIG. 24B, the layer 254 has been patterned to form the shape of the inorganic posts, and has been anodized to form $Al_2O_3$ or $Ta_2O_5$ inorganic posts 256. Advantageously, anodized $Al_2O_3$ or $Ta_2O_5$ forms a dielectric layer which is free from pinhole defects, greatly reducing the chance of a short between the mechanical layer deposited thereover and the optical stack 16.

As discussed above, it is easier to consistently and conformally deposit rivet material over a tapered aperture. However, because of the tapered shape, certain rivet structures may be susceptible to downward deflection of the edges of the rivet structures, particularly in embodiments in which the rivet layer is thin relative to the mechanical layer. In certain embodiments, it may be desirable to provide additional underlying support for a rivet structure, in order to constrain such downward deflection of the edges of the rivet structure. FIGS. 25A-25H and FIG. 26 illustrate embodiments in which additional support may be provided through modification of a support structure.

Figure 25A:
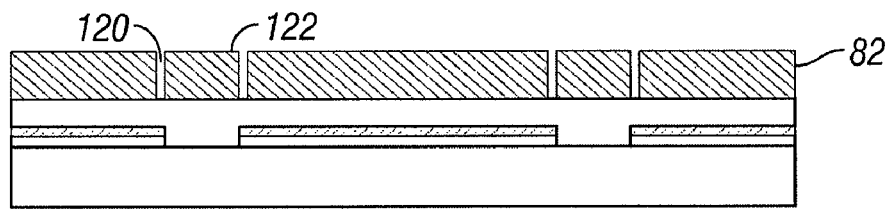
FIGS. 25A-25H are schematic cross-sections illustrating a method for fabricating an interferometric modulator element comprising support structures located above a movable layer and an additional support structure comprising sacrificial material located underneath the movable layer.

In one embodiment, described with respect to FIGS. 25A-25H, sacrificial material which is protected from the release etch may be utilized to provide additional support to the rivet structure. This process for fabricating an interferometric modulator element comprising such supports includes the steps described with respect to FIGS. 9A-9D. In FIG. 25A, the sacrificial layer 82 is patterned and etched to remove annular sections 120 of sacrificial material, leaving columns 122 of sacrificial material separated from the remainder of the sacrificial layer 82.

Figure 25B:
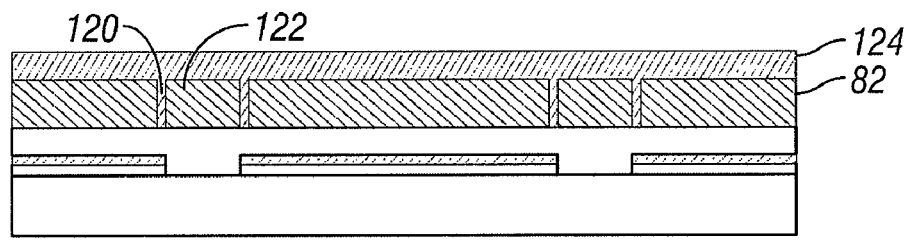
Figure 25C:
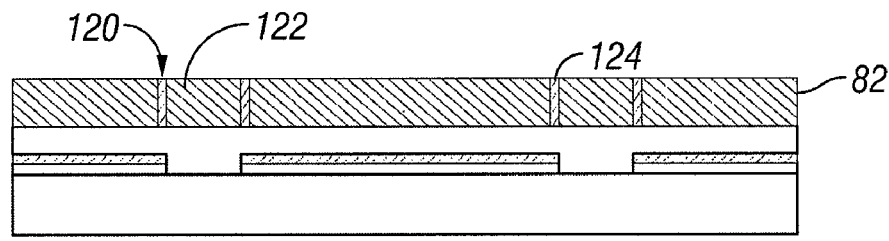

In FIG. 25B, protective material 124 is deposited such that it fills annular sections 120. As can be seen, the protective material preferably completely fills the annular sections 120. Advantageously, the material comprising the sacrificial layer 82 is selectively etchable relative to the protective material 124, which may be, for example, a polymeric material or a photoresist material. Advantageously, the protective material 124 may comprise a self-planarizing material, such as spin-on-dielectric, so as to facilitate filling the annular section 120, and so as to provide a planar surface for the subsequent deposition of an overlying movable layer. However, depending on the size of the annular structure 120 and the method used to deposit the protective material 124, a variety of materials may be suitable for use as the protective material 124. In FIG. 25C, it can be seen that the protective material has been etched back to the level of the sacrificial layer 82, such that the upper surface of the isolated columns 122 of sacrificial material is exposed.

Figure 25D:
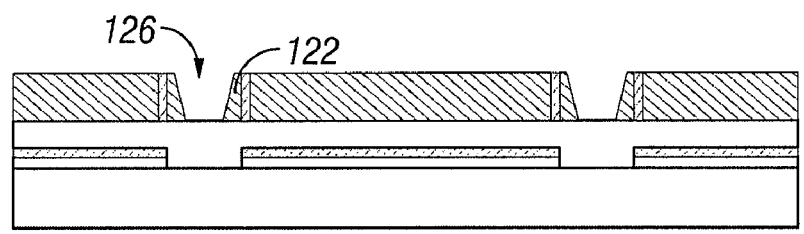
Figure 25E:
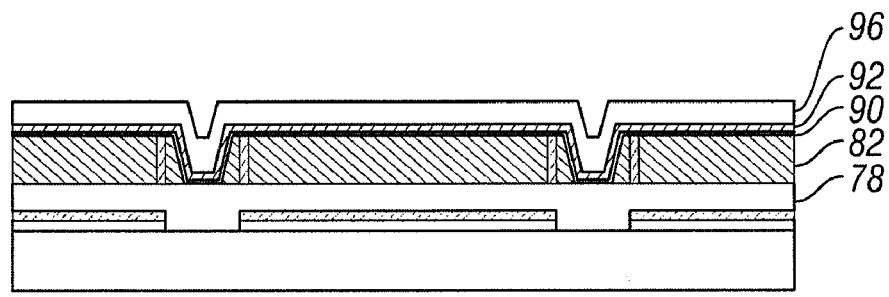

In FIG. 25D, a second patterning and etching process is utilized to form tapered apertures 126 within the isolated columns 122 of sacrificial material. In FIG. 25E, a reflective layer 90 and a mechanical layer 92 are deposited over the sacrificial material, followed by the deposition of a rivet layer 96 over the mechanical layer. It will be understood that variations in the fabrication process as discussed above may advantageously be used to remove the portion of the reflective layer 90 which will underlie the support post, as depicted in FIG. 25E.

Figure 25F:
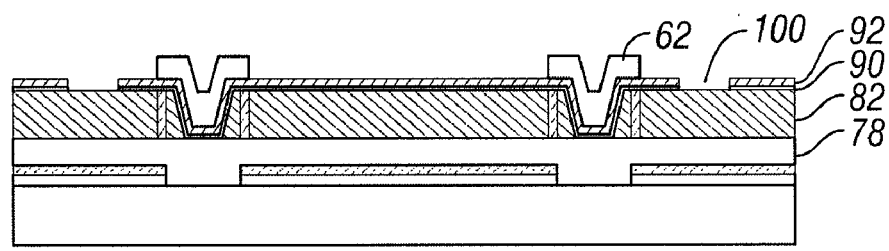
Figure 25G:
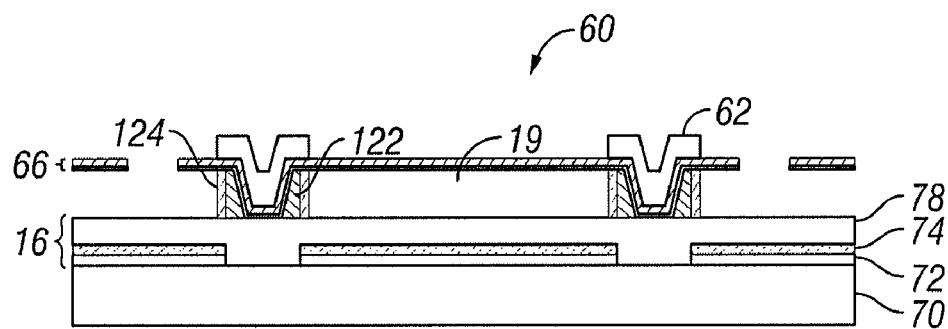
Figure 25H:
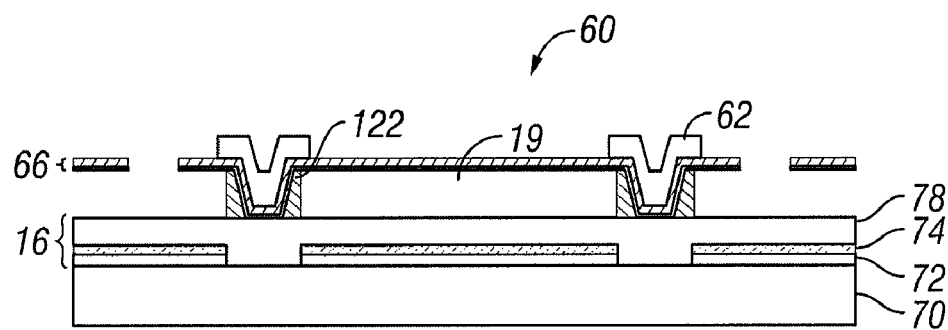

In FIG. 25F, the rivet layer 96 is etched to form support structures 62, and the mechanical layer 92 and reflective layer 90 are subsequently patterned and etched to form etch holes 100 and optionally also to separate strips of the movable layer 66, as shown in FIG. 8. Thus, FIG. 25F shows an unreleased MEMS device. In FIG. 25G, a release etch is performed to remove those portions of the sacrificial layer 82 not enclosed by the annular sheaths of protective material 124 (e.g., the columns 122). At this point, an interferometric modulator element 60 is formed having rivet structures 62 overlying the movable layer 66, and columns 122 of unetched sacrificial material surrounded by sheaths of protective material 124 located underneath and around the depressions in the movable layer 66. Optionally, the sheath of protective material 124 may be removed by a subsequent step, through, for example, an ashing or etching process, resulting in an interferometric modulator comprising posts of exposed, but unetched, sacrificial material, as seen in FIG. 25H.

Figure 26A:
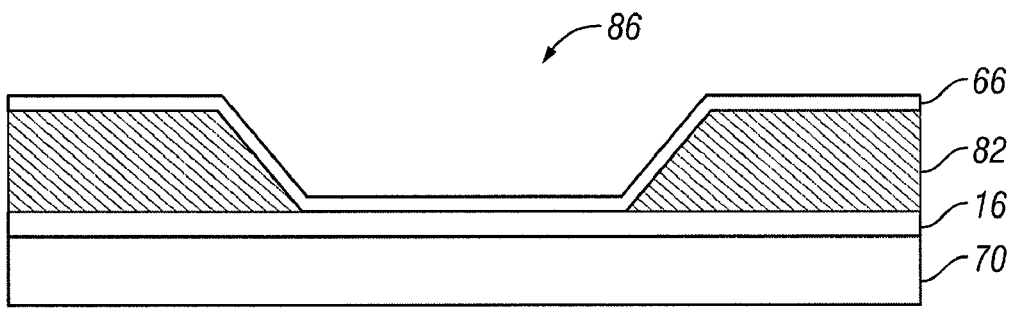
FIGS. 26A-26B and 26D-26E are schematic cross sections illustrating certain steps in the fabrication of an interferometric modulator having an alternate support structure made from spin-on material.
Figure 26B:
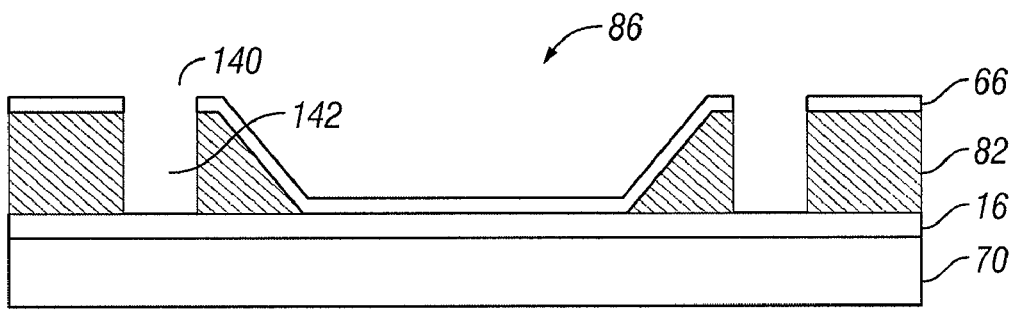
Figure 26C:
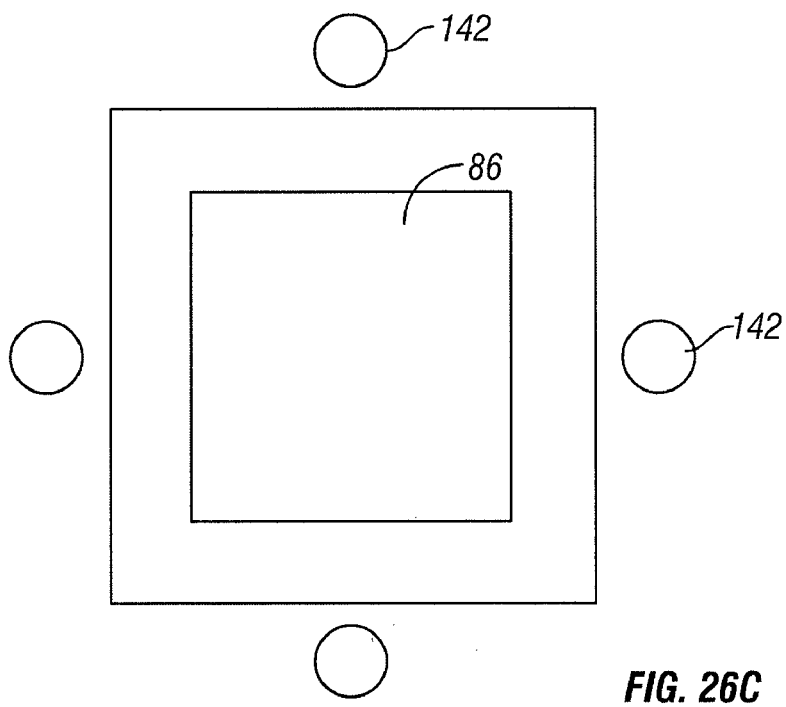
FIG. 26C is a top view of the partially fabricated interferometric modulator of FIG. 26B.
Figure 26D:
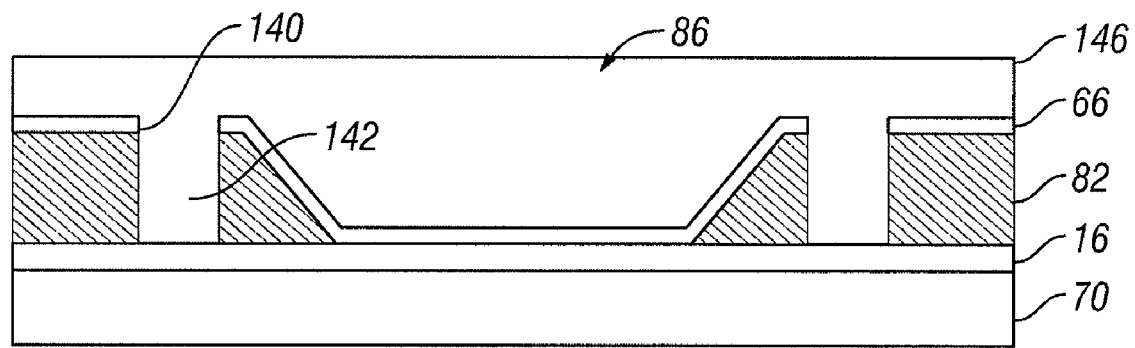

In yet another embodiment, desired supplemental support for rivet support structures such as 62 may be provided through use of the same material used to form the rivet structures. In one embodiment, described with respect to FIGS. 26A-26E, an alternate support post and rivet structure is formed from a spin-on material. In FIG. 26A, it can be seen that a layer of sacrificial material 82 has been deposited and patterned to form tapered apertures 86, and a movable layer 66 has been deposited over the patterned sacrificial material 82. In FIG. 26B, holes 140 have been patterned in the movable layer 66, and the sacrificial material 82 is etched to form vias 142 which extend, in this embodiment, from the holes 140 to the underlying optical stack 16. FIG. 26C depicts an overhead view of this area at this point in the fabrication process, in which it can be seen that multiple vias 142 surround the depression corresponding to the tapered aperture 86. Any number or shape of the vias may be utilized, and the tapered aperture 86 may take multiple possible shapes. In FIG. 26D, a layer 146 of spin-on material is deposited. The spin-on material, or other self-planarizing material, will flow to fill the vias 142. In this embodiment, the spin-on material fills the tapered aperture 86, and flows through the holes 140 to fill the vias 142. Finally, in FIG. 26E, it can be seen that the spin-on material is cured and patterned to remove the spin-on material located away from the tapered aperture 86 and the vias 142, forming a support structure 150 which comprises a rivet-like upper portion and post-like structures or legs 152 extending from the rivet-like portion through the movable layer 66 to the optical stack 16. The sacrificial layer 82 (see FIG. 26D) has also been removed by a release etch to form an interferometric gap 19. Advantageously, the legs 152 lend stability to the support structure, such that the sloped portion of the mechanical layer is not so easily pulled down into the cavity beneath it during operation, and the adhesion between the rivet and the mechanical layer is thereby enhanced. The rivet structure 150 is also adhered to the underlying optical stack, anchoring the rivet structure in place.

Figure 26E:
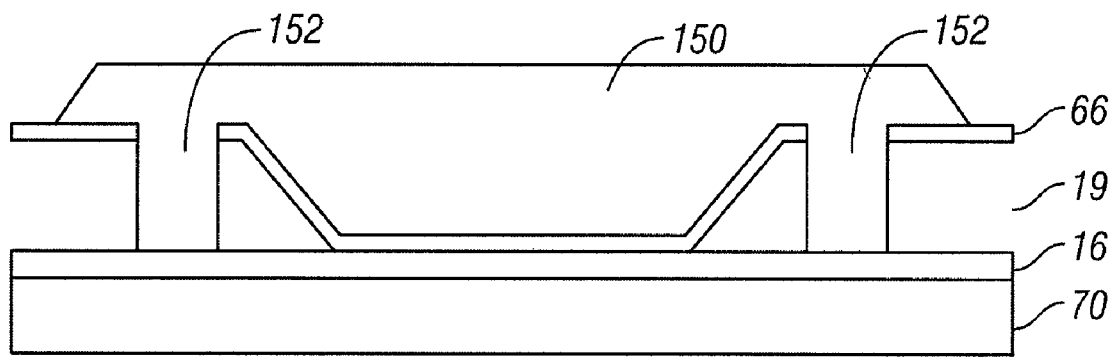
Figure 27:
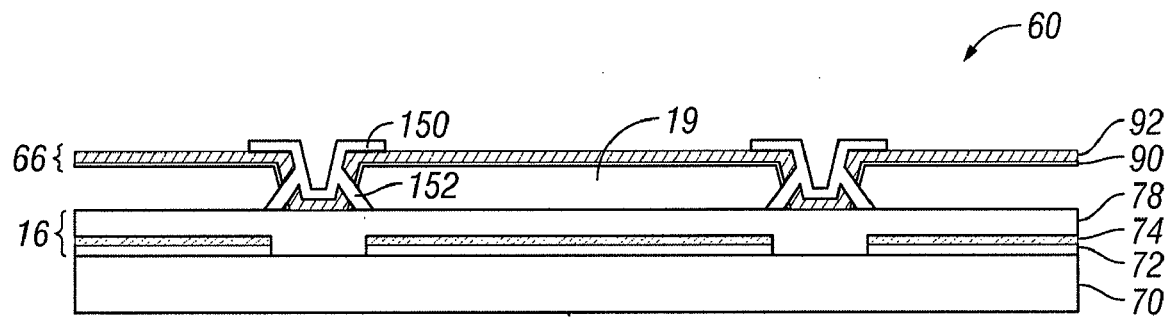
FIG. 27 is a schematic cross-section illustrating an interferometric modulator in which a portion of a support structure underlies a movable layer, wherein the underlying portion of the support structure is formed at the same time as the overlying portion of the support support structure.

It will be understood that variations can be made to the above process flow. In certain embodiments, the holes 140 may be formed in the portions of the movable layer 66 overlying the sidewalls of the tapered aperture 86. In other embodiments, the cavities 142 need not be vertical cavities, as depicted in FIG. 26B, but may extend in a diagonal direction, or may not extend all the way through the sacrificial layer to the optical stack 16. For example, the holes 140 may be formed in the movable layer 66 in the sidewalls of the apertures 86, and the cavities 142 may extend in a diagonal direction down to the optical stack 16. FIG. 27 illustrates such an embodiment, in which overlying support structures 150 comprise legs 152 which extend at an angle through holes in the tapered portion of the movable layer 66. Such an angled etch may be performed, in one embodiment, through the use of a reactive ion etch (RIE), although other suitable techniques may also be used. In certain embodiments, the support structures 150 may comprise discrete legs 152, as shown in FIGS. 26E and 27, or may comprise a continuous annular support structure.

Figure 28A:
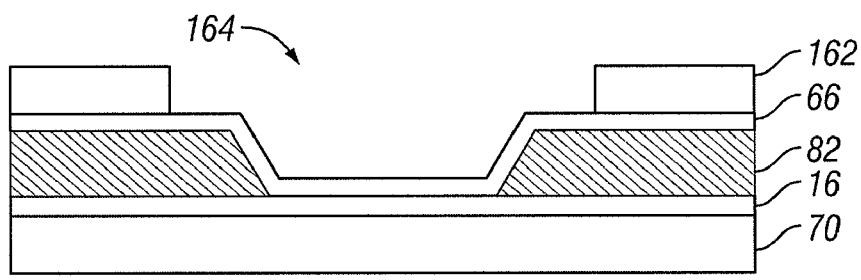
FIGS. 28A-28B are schematic cross sections illustrating certain steps in the fabrication of an interferometric modulator in which plating is used to form a rivet structure.
Figure 28B:
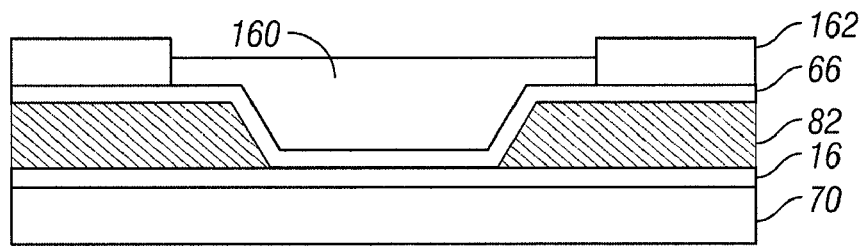

Various other methods may be used to form support structures and other components of the interferometric modulator. In certain embodiments, a plating process can be utilized to form component of an interferometric modulator such as rivet and post support structures. FIGS. 28A-28B illustrate a portion of a process for utilizing a plating process to form a rivet structure 160. This process includes the steps of FIGS. 9A-9F. In FIG. 28A, it can be seen that a mask 162, which may be a photoresist mask in certain embodiments, is deposited over the movable layer 66, and patterned to form an aperture 164 which will define the shape of the desired rivet structure. In FIG. 28B, it can be seen that a plating process has been used to form a rivet structure 160 within the aperture 164. In one embodiment, the plating process is an electroplating process. In various embodiments, the rivet 160 may comprise materials included, but not limited to, nickel, copper, and gold, but any material that can be plated and is preferably not susceptible to the release etch may be used.

Figure 29:
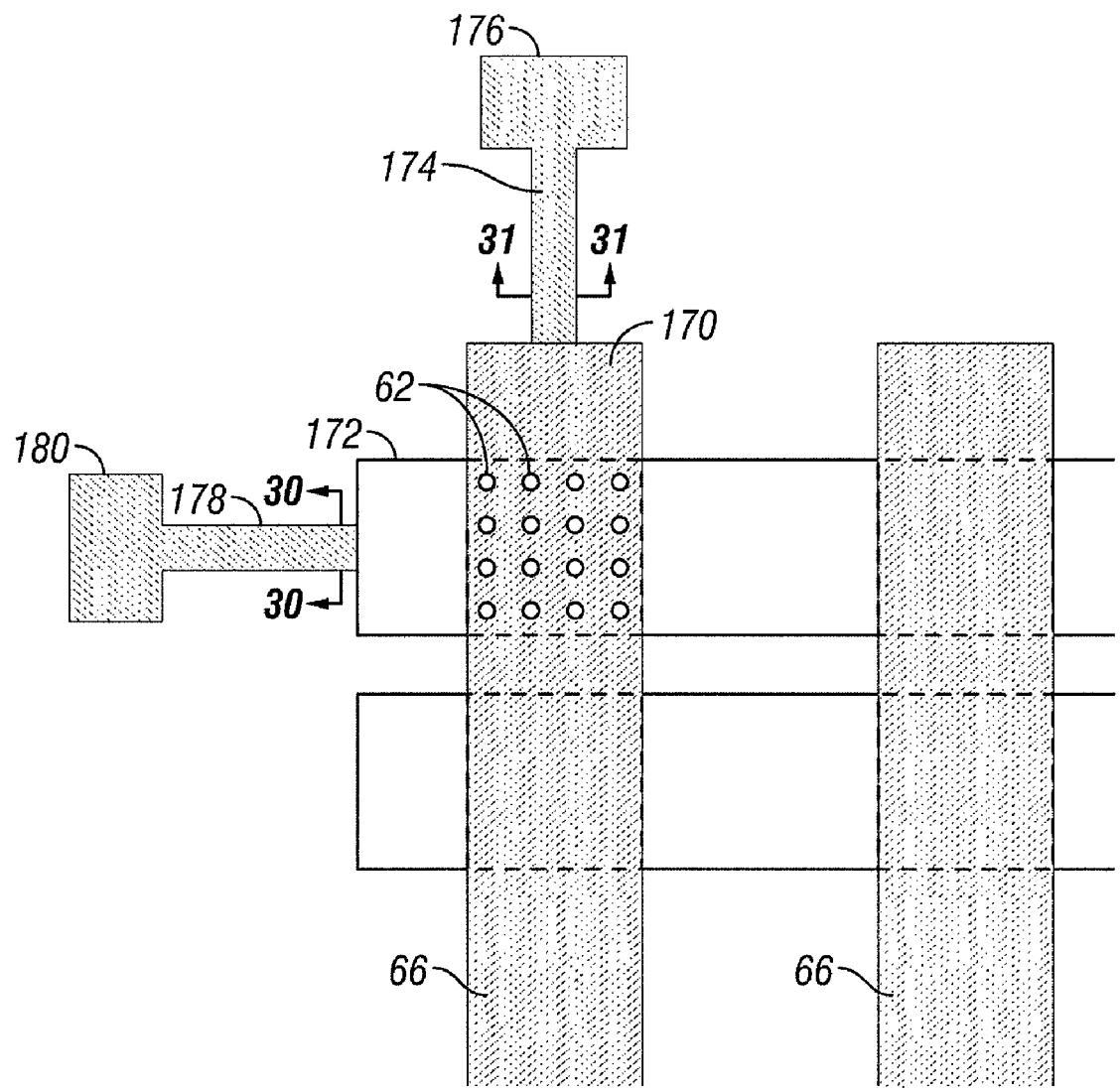
FIG. 29 is a top view illustrating a portion of an array of interferometric modulators and certain external components connected to the strip electrodes within the array.

In addition to forming the various components of the interferometric modulators, the layers deposited in the fabrication processes discussed herein can also be used to form other components within or connected to an array of interferometric modulator elements. FIG. 29 depicts a portion of an interferometric modulator element in which a movable layer 66 forms a strip electrode 170, and a conductive layer such as a conductive layer 72 within the optical stack 16 (see FIG. 9A) forms a second strip electrode 172 which runs beneath and perpendicular to the first strip electrode 170. It can also be seen that multiple support structures may be provided across the length of the strip electrode 170, such as rivet structures 62. The first, or upper, strip electrode 170 is electrically connected to a conductive interconnect or lead 174, which may in turn be electrically connected to a landing pad or connection point 176, at which an electrical connection may be made with an external component, such as a bump. Similarly, the second, or lower, strip electrode 172 is electrically connected to a lead 178 and a connection point 180. The first strip electrode 170, which may also be referred to as a column electrode (although it will be understood that the designation of the upper electrode as the column electrode is arbitrary and depends simply on the orientation of the MEMS array), is generally spaced apart from the substrate by an air gap or interferometric cavity within the array, although it will be understood that at various locations within the array (e.g., at the support regions), no air gap may exist between the column electrode 170 and the substrate. The second strip electrode 172, which may also be referred to as a row electrode, is generally fabricated either directly on the substrate, or if there are intervening layers, such that no interferometric gap exists between the second strip electrode 172 and the substrate).

In certain embodiments in which the lead 178 and the connection point 180 are formed from ITO with no overlying layers, a connection may be made directly between an external device and the connection point 180. However, the high resistivity and contact resistance with ITO may make such an embodiment undesirable. In another embodiment, a layer of conductive material, such as the material which forms the movable layer 66, may be deposited over the ITO for most of the length of the connection point 180 and lead 178, in order to reduce the resistance of that portion of the structure. However, in certain embodiments in which the mechanical layer comprises a deformable reflective layer formed from two layers (e.g., a mechanical layer 92 and reflective layer 90, as can be seen in FIG. 9F), contact resistance between certain of those layers may have an undesirable effect on the resistance of the lead 178, particularly when one of those layers is aluminum, which has poor contact resistance in contact with an ITO layer.

Figure 30A:
FIGS. 30A-30B are schematic cross sections illustrating certain steps in the forming of a lead connected to a strip electrode, viewed along the line 30-30 of FIG. 29.
Figure 30B:
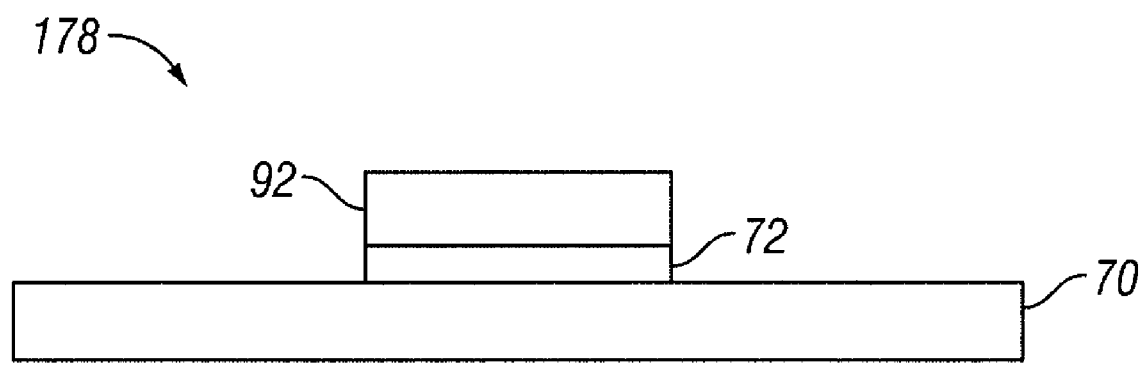

Advantageously, a conductive material may be deposited over the ITO layer which has desirable contact resistance in contact with the ITO layer. FIGS. 30A and 30B depict steps in such a fabrication process, showing cross-sections taken along line 30-30 of FIG. 29. In FIG. 30A, it can be seen that at a stage in the fabrication process prior to the deposition of the mechanical layer (e.g., a stage corresponding to FIG. 9E or earlier), only a layer 72 of ITO has been deposited at this area (or any overlying layers, such as partially reflective layer 74 of FIG. 9A, have been selectively removed). In FIG. 30B, however, the mechanical layer 92 has been deposited not only over the layers in the area where the interferometric modulator element is to be formed, but also over the connection point 180 (not shown) and the lead 178, and thus directly overlies the ITO layer 72. It can also be see that the reflective layer 90 (see FIG. 9E) has either not been deposited over the ITO layer 72, or has been selectively removed after deposition and prior to the deposition of mechanical layer 92. In one embodiment, the reflective layer 90 (see FIG. 9E) is deposited over the lead 178 and connection point 180, but patterned and etched to remove those portions of the reflective layer prior to the deposition of the mechanical layer 92. In one embodiment, the mechanical layer comprises Ni, which has favorable contact resistance in contact with ITO. The mechanical layer 92 is then patterned and etched to remove the portions of the layer not overlying the lead 178 or connection point 180, as seen in FIG. 30B. Also, as can be seen with respect to FIG. 29, the mechanical layer (shown as shaded) is preferably also removed at the edge of the lead close to the array, to avoid shorting the strip electrodes 170 and 172 to one another.

Thus, in one embodiment, the mechanical layer is utilized as a conductive layer in contact with the ITO leads and connection points. In another embodiment in which the rivet material comprises a conductive material, the rivet material can instead be deposited over the ITO and used to form the conductive layer over the ITO, in place of the mechanical layer 92 of FIGS. 30A-30B. In a particular embodiment the rivet layer comprises Ni. Advantageously, this embodiment does not involve patterning and etching one portion of a deformable reflective layer (the reflective layer) separately from the other portion (the mechanical layer).

In a particular embodiment, the mechanical layer 92 comprises Ni, which has desirable resistance and contact resistance properties, but a wide variety of mechanical layer materials may be used. In another embodiment, the ITO layer need not extend all the way through the lead 178 to the connection point 180. Rather, the deposited mechanical layer 92 may alone form the connection point 180 and a large portion of the lead 178. In addition to lowering the resistance and contact resistance of these components, the deposition of the mechanical layer 92 also advantageously increases the height of these components, facilitating connections between external components.

Similarly, the mechanical layer 92 may form the lead 174 and the connection point 176. In one embodiment, there is no need for the lead 174 or connection point 176, which are in connection with column electrode 170, to comprise any ITO, and the mechanical layer 92 may extend the entire length of the lead 174 in order to form a connection between the lead 174 and the strip electrode 170. This is because the column electrode 170 is separated from the substrate, unlike the row electrode 172 which is formed on the substrate (e.g., a patterned strip of ITO).

Figure 31A:
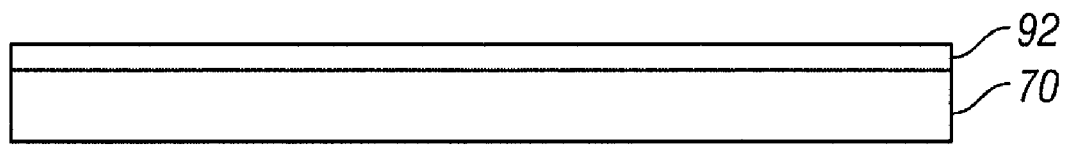
FIGS. 31A-31D are schematic cross sections illustrating certain steps in the forming and passivating of a lead connected to a strip electrode, viewed along the line 31-31 of FIG. 29.
Figure 31B:
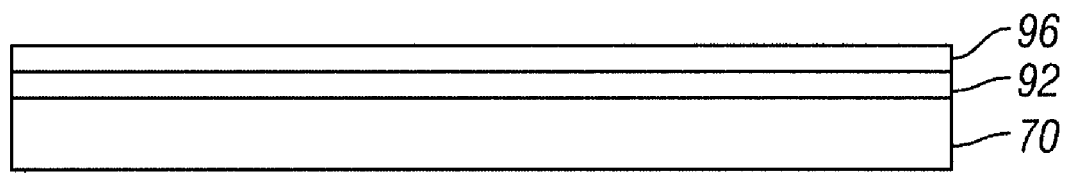
Figure 31C:
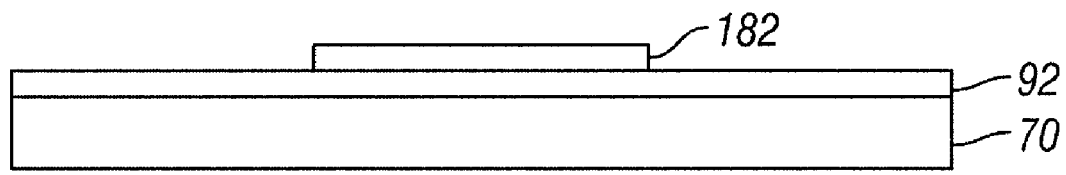
Figure 31D:
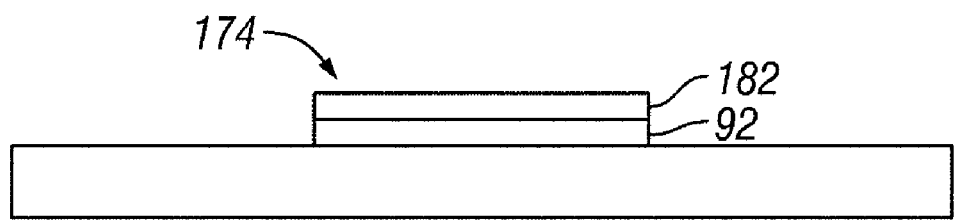

Because the row and column leads would otherwise be exposed, and thus vulnerable to shorting and other damage which may occur due to environmental or mechanical interference, it may be desirable to deposit a passivation layer over the exposed row and column leads 174 and 178. In a particular embodiment, the same material which is used to form the rivet structure 62 can be utilized to passivate the leads 174, 178, protecting them from external electrical or mechanical interference. Such an embodiment is described with respect to FIGS. 31A-31D. In FIG. 31A, which is a cross section of a partially fabricated lead 174 of FIG. 29 taken along the line 31-31 in accordance with a different embodiment, it can be seen that the mechanical layer 92 has been deposited, but not yet etched. In FIG. 31B, it can be seen that the layer 96 of rivet material has been deposited (as seen in, for example, FIG. 9G), and this layer of rivet material has also been deposited over the mechanical layer 92 located outside the array of interferometric modulators. In FIG. 31C, it can be seen that the layer of rivet material has been patterned (as seen in FIG. 9H), and that the layer of rivet material has simultaneously been patterned to form a strip 182 which will overlie the lead 304. Finally, in FIG. 31D, the mechanical layer has been patterned to separate the strip electrode 170 from the surrounding electrodes (and to form any necessary etch holes in the strip electrode), and is simultaneously patterned to form the lead 174. In an alternate embodiment, the mechanical layer may be patterned and etched at the same time as the rivet layer. It will be understood that this rivet layer is either not deposited over the connection point 180, or is etched to remove the portion of the rivet layer which covers the connection point 180, in order to permit a connection to be made with an external component. It will also be understood that if the lead 178 (see FIG. 19) in connection with the row electrode is passivated in accordance with the above process, the resultant lead 178 may comprise a layer of ITO 72 underlying the mechanical layer 92.

Figure 32:
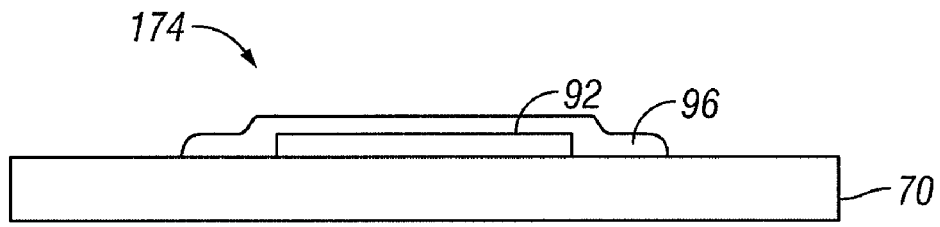
FIG. 32 is a schematic cross section illustrating a stage in an alternate method of forming and passivating a lead connected to a strip electrode, viewed along the line 31-31 of FIG. 29.

In yet another embodiment, the mechanical layer 92 may be patterned prior to the deposition of the rivet layer, forming the lead 174 and separating the strip electrode 170 from the neighboring strip electrodes. Thus, the rivet layer may be subsequently patterned so as to cover not only the upper portion of the lead 174, but also to protect the sides, as can be seen in FIG. 32, which depicts a lead 174 fabricated by this process viewed along the line 31-31 of FIG. 19. Advantageously, this further protects the lead 174. In other embodiments, passivation material may be deposited over the leads in a process distinct from the deposition of the support structure layer. In such a process, any suitable dialectic layer may be used to passivate the lead, and need not be suitable for use as a support structure layer. For example, any suitable dielectric layer used in the fabrication of the MEMS device, such as for example the dielectric layer within the optical stack or a dialectic layer used as an etch stop layer, may be used to passivate a lead.

In certain embodiments, it may be desirable to provide a movable layer 66 having varying stiffness over different parts of an MEMS element, or to more easily provide an array of MEMS elements wherein adjacent elements comprise movable layers having differing stiffness. For example, a modulator element in which the movable layer has different actuation voltages in different areas can be used to create grayscale, as differing amounts of the modulator elements can be actuated by modifying the applied voltage, as the actuation voltage will vary across the array of modulator elements. In other embodiments, additional stiffness may be desirable in areas which have less support, such as around the edges of the modulator element. One method of fabricating an interferometric modulator element having such a varying stiffness is described with respect to FIGS. 23A-23B and comprises the steps of FIGS. 9A-9G.

Figure 33A:
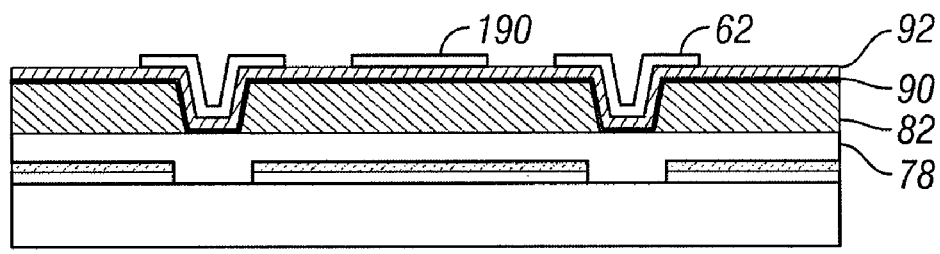
FIGS. 33A-33B are schematic cross-sections illustrating steps in a method for fabricating an interferometric modulator having a movable layer with varying stiffness due to residual patches of support material.
Figure 33B:
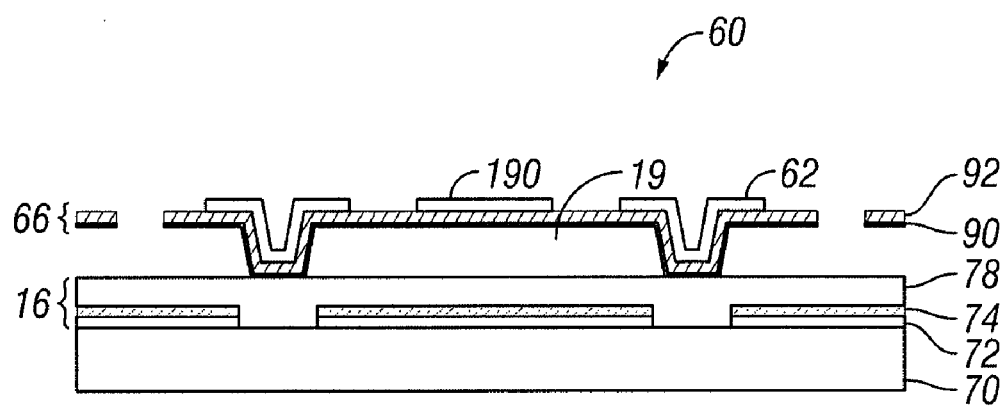
Figure 34:
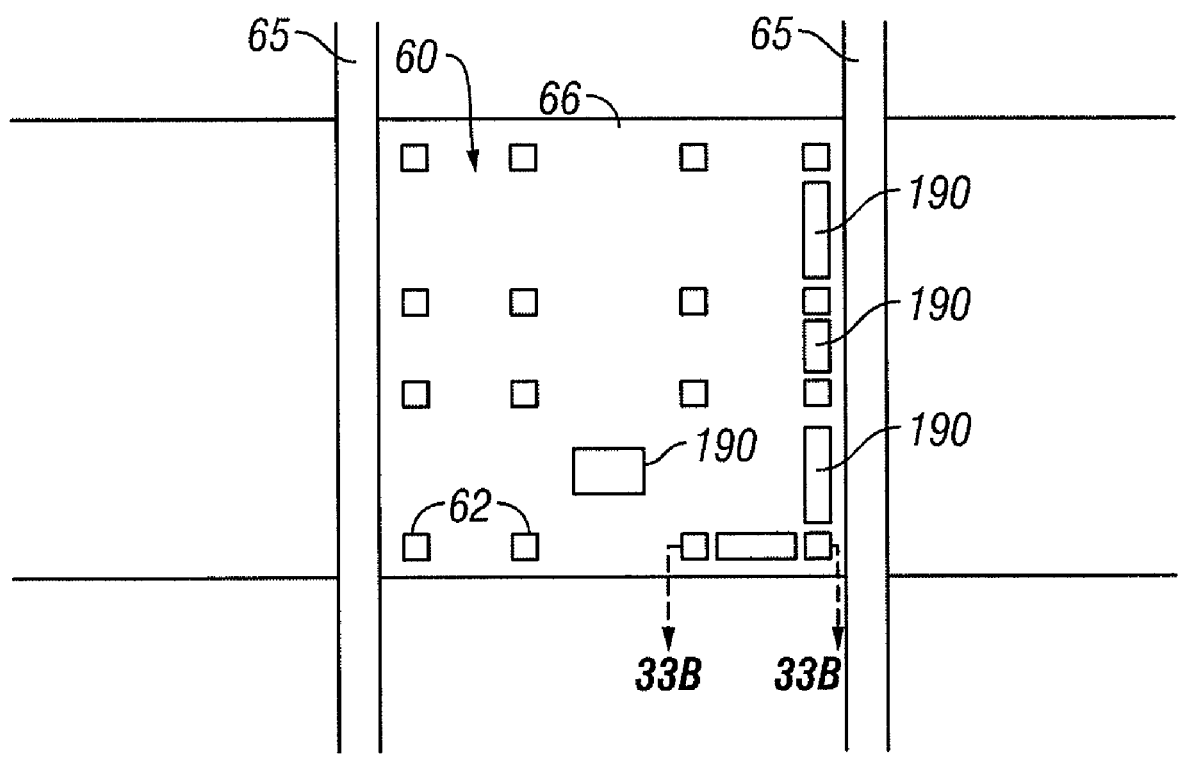
FIG. 34 illustrates a top view of an interferometric modulator element formed using the steps of FIGS. 33A-33B.

In FIG. 33A, it can be seen that the rivet layer, which in this embodiment may comprise silicon oxide, has been etched to form support structures 62, as described with respect to FIG. 9H. However, the embodiment of FIG. 33A differs from that of 9H, in that additional patches, or ribs, 190 of the rivet material have been left unetched. In FIG. 33B, it can be seen that the fabrication process is completed as discussed with respect to FIGS. 9I and 9J, resulting in an interferometric modulator element 60 (viewed along the line 33B-33B of FIG. 34) having support structures 62 and ribs 190 overlying portions of the movable layer 66. A top view of the interferometric modulator element 60 of FIG. 33B having residual ribs 190 comprising rivet material is depicted in FIG. 24.

As discussed above, these residual ribs 190 may inhibit deformation of the movable layer 66 in the area surrounding the patch, such that that section of the movable layer 66 will require a higher actuation voltage. They may also be used to provide additional support to the mechanical area near the edges of the movable layer. In certain embodiments, the movable layer 66 may be susceptible to undesired curling or flexure. This may be particularly problematic at those areas of the movable layer 66 close to the gaps 65 between the strip electrodes of the movable layer 66. The placement of such ribs 190 may control this undesired flexure, so as to ensure that the height of the interferometric gap 19 (see FIG. 23B) remains more constant across an interferometric modulator. In addition, as the positioning of these ribs structures 190 affects the stiffness of the movable layer 66 in the surrounding area, these rib structures 190 may be used to modify the actuation voltage required to move the MEMS device into an actuated state. This may be done, for instance, to normalize the actuation voltage across the element, or alternately to provide a differing actuation voltage across the MEMS element, such as to provide grayscale, as discussed above.

In a further embodiment, the rivet layer which is etched to form support structures 62 and residual rib structures 190 may comprise an electroactive material, such as a piezoelectric material. Through the application of electroactive material to the upper surface of the mechanical layer 92 in the form of ribs 190, the behavior of the movable layer 66 can be further controlled. The application of electroactive material can, for instance, be used to modify the voltage applied at a given location in the modulator element.

As discussed above, the methods and structures discussed above may be used in conjunction with an optical MEMS device having a movable layer comprising a reflective layer which is partially detached from a mechanical layer. FIGS. 35A-35H illustrate an exemplary process for forming support posts underlying a portion of the movable layer in such a MEMS device, which in the illustrated embodiment is an interferometric modulator. This process may include, for example, the steps described with respect to FIGS. 9A-9D, in which an optical stack is deposited, and a sacrificial layer is deposited over the optical stack.

Figure 35A:
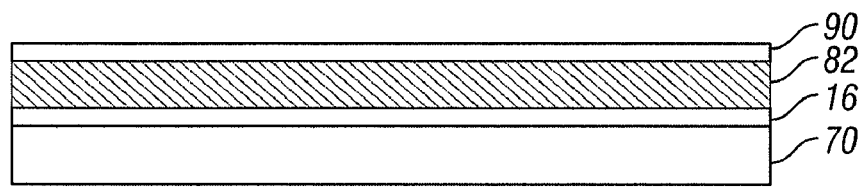
FIGS. 35A-35H are schematic cross-sections illustrating steps in a method for fabricating an interferometric modulator having a movable layer which includes a reflective layer which is partially separated from a mechanical layer and having a post structure which underlies at least a portion of the movable layer.

In FIG. 35A, it can be seen that a reflective layer 90 is deposited over the sacrificial layer 82. In certain embodiments, the reflective layer 90 may comprise a single layer of reflective material. In other embodiments, the reflective layer 90 may comprise a thin layer of reflective material with a layer of more rigid material (not shown) overlying the thin layer of sacrificial material. As the reflective layer of this embodiment will be partially detached from an overlying mechanical layer, the reflective layer 90 preferably has sufficient rigidity to remain in a substantially flat position relative to the optical stack 16 even when partially detached, and the inclusion of a stiffening layer on the side of the reflective layer located away from the optical stack can be used to provide the desired rigidity.

Figure 35B:
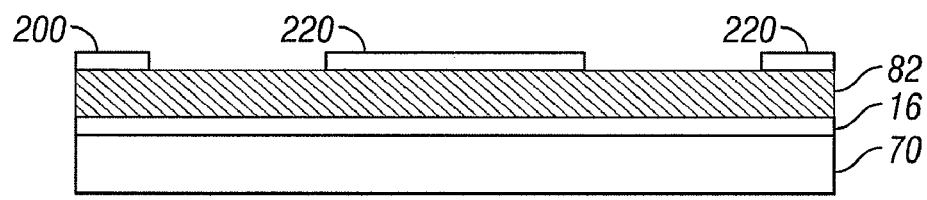

In FIG. 35B, the reflective layer 90 of FIG. 35A is patterned to form a patterned mirror layer 220. In one embodiment, the patterned mirror layer 220 comprises a contiguous layer in which apertures corresponding to the locations of (but wider or narrower than) support structures have been formed. In another embodiment, the patterned mirror layer 220 may comprise multiple reflective sections detatched from one another.

Figure 35C:
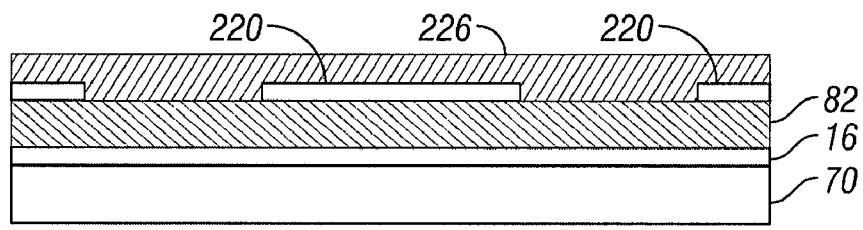
Figure 35D:
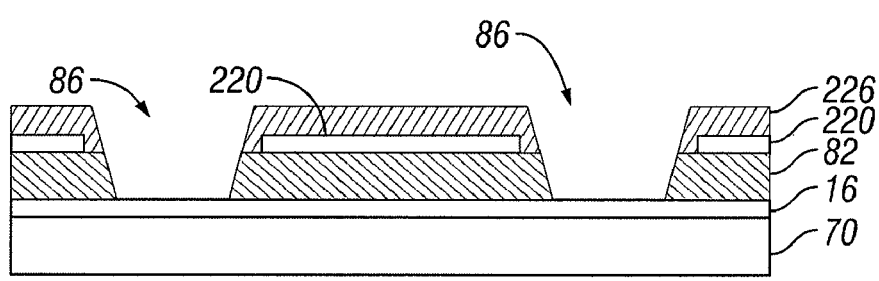

In FIG. 35C, a second sacrificial layer 226 is deposited over the patterned mirror layer 220. Preferably, the second sacrificial layer 226 is formed from the same material as the first sacrificial layer 82, or is etchable selectively with respect to surrounding materials by the same etch as the first sacrificial layer 82. In FIG. 35D, tapered apertures 86 are formed which extend through both the second sacrificial layer 226 and the first sacrificial layer 82.

Figure 35E:
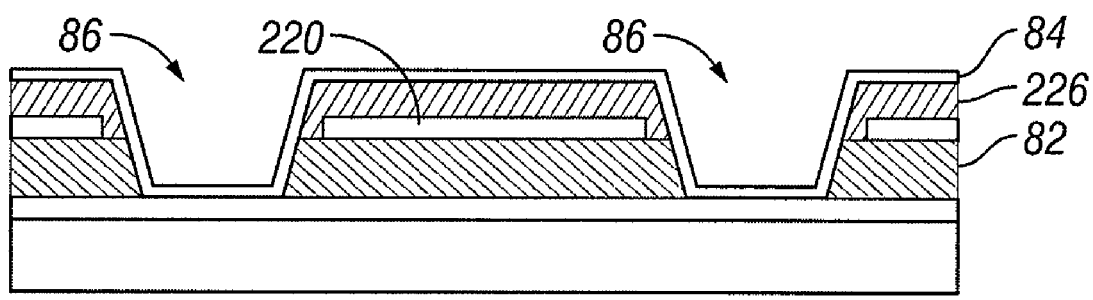
Figure 35F:
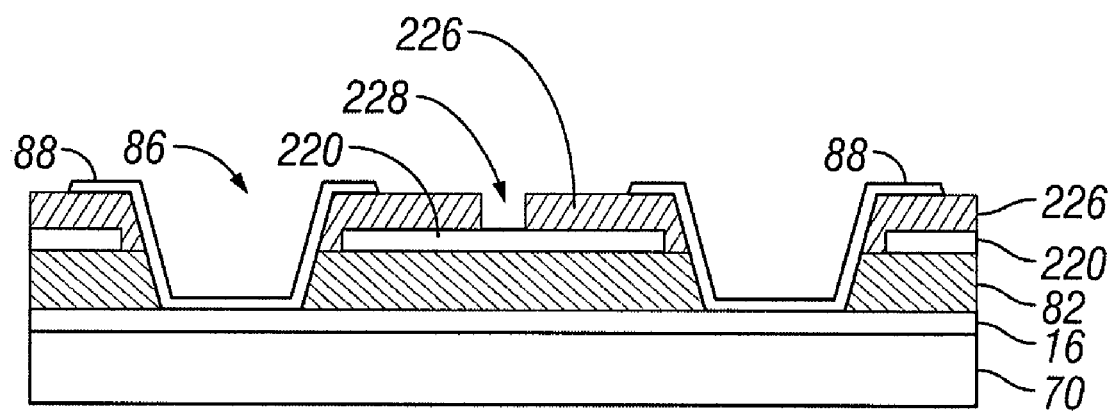

In FIG. 35E, a layer of post material 84 has been deposited over the patterned sacrificial layers 92 and 226, such that it coats the sides of the apertures 86, as described with respect to FIG. 11D. In FIG. 35F, the layer of post material has been patterned to form post structures 88, as described with respect to FIG. 11E. The patterned post structures 88 may overlap with the edges of the mirror layer 220. It can also be seen in FIG. 35E that an aperture 228 has been formed in a portion of the second sacrificial layer 196 overlying the patterned mirror layer 220, exposing at least a portion of the patterned mirror layer 220.

Figure 35G:
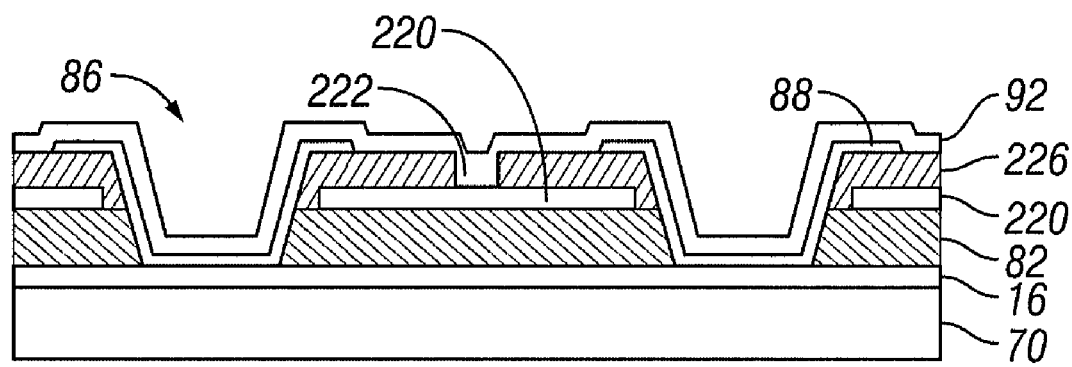

In FIG. 35G, a mechanical layer 92 is deposited over the posts 88 and the exposed portions of the second sacrificial layer 226 and the patterned mirror layer 220. IN particular, it can be seen that the mechanical layer 92 at least partially fills the aperture 198 (see FIG. 35F), such that a connector portion 222 connecting the mechanical layer 92 and the patterned mirror layer 220 is formed.

Figure 35H:
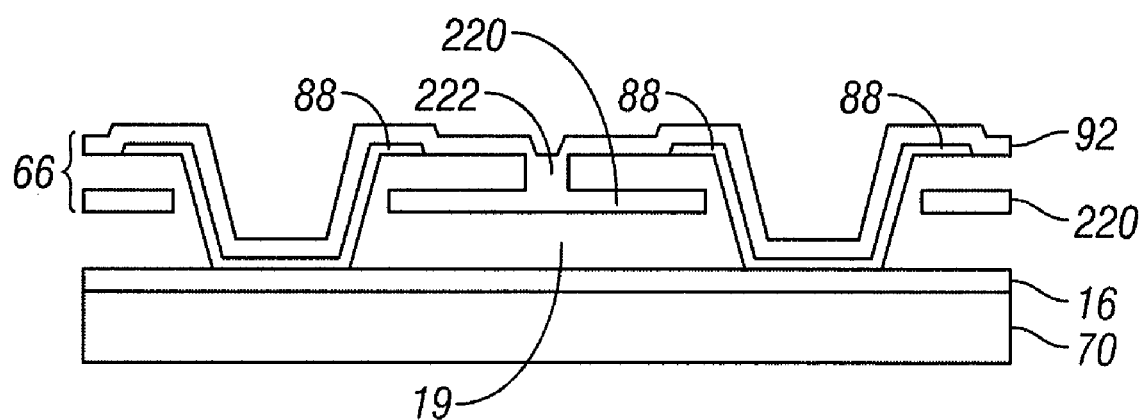

In FIG. 35H, a release etch is performed which removes both the first sacrificial layer 82 and the second sacrificial layer 226, thereby forming an interferometric gap 19 between the patterned mirror layer 220 and the optical stack. Thus, an optical MEMS device is formed, which includes a movable layer 66 comprising a mechanical layer 92 from which a patterned mirror layer 220 is suspended, where the patterned mirror layer 220 is partially detached from the mechanical layer 92. This optical MEMS device, may be, for example, an interferometric modulator such as that described with respect to FIG. 7C and elsewhere throughout the application. In non-optical MEMS, the suspended upper electrode need not be reflective.

It will be understood that the above process may be modified to include any of the methods and structures discussed above. In particular, it will be seen that the above process may be modified to include the formation of a rivet structure, either instead of or in conjunction with the formation of a post structure. In particular, in an embodiment in which only rivet structures are formed, the above process may be further simplified by forming the tapered apertures at the same time as the aperture overlying a portion of the mirror layer in which the connecting portion will be formed. In another embodiment in which a rivet layer is deposited, only a very thin layer of conductive material may be deposited in a step equivalent to that of FIG. 35G, and a later deposited rivet layer (which can be dielectric) may be patterned and etched to serve the mechanical function of the mechanical layer, with the thin layer of conductive material serving the conductive function.

Figure 36A:
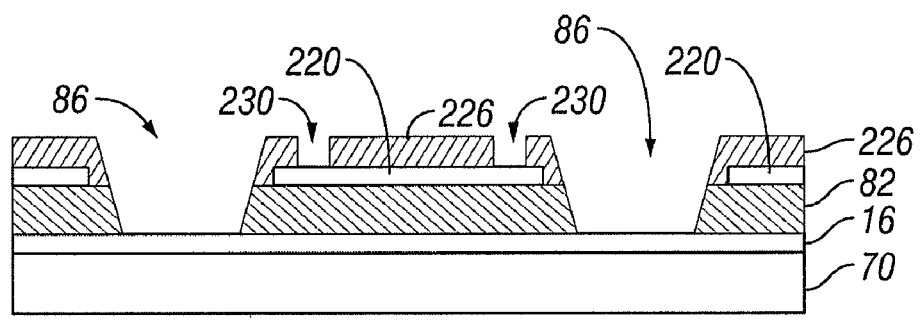
FIGS. 36A-36C are schematic cross-sections illustrating steps in a method for fabricating an interferometric modulator having stiffening structures formed on an upper surface of a reflective layer which is partially separated from a mechanical layer.
Figure 36B:
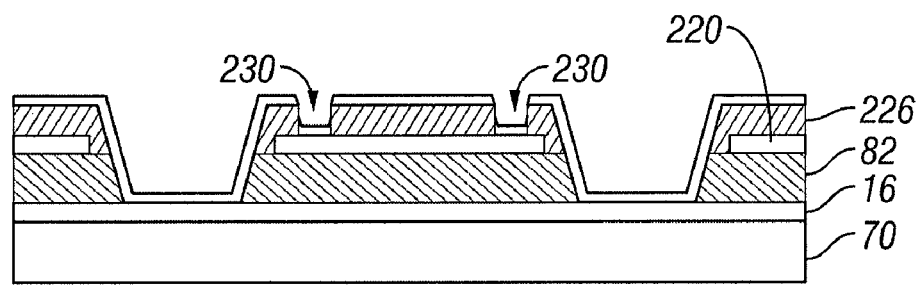
Figure 36C:
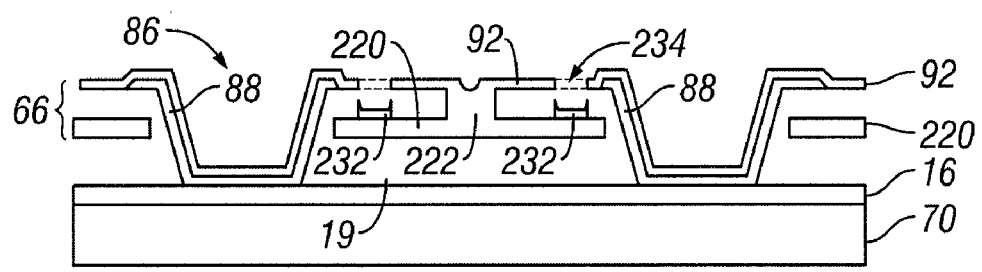

In a further embodiment, the same material which forms the post structures may be used to form stiffening portions on the upper surface of a detached mirror layer 200. FIG. 36A-36C illustrate such an embodiment, which includes the steps of FIGS. 35A-35C. In FIG. 36A, it can be seen that at the same time as the tapered apertures 86 are formed, additional apertures 230 have been formed over the patterned mirror layer 220, exposing portions of the patterned mirror layer 220. In certain embodiments, these apertures 230 may advantageously take the form of grooves extending near edges of the patterned movable layer 220, however a wide variety of shapes, including annular or substantially annular shapes, may be suitable.

In FIG. 36B, it can be seen that a layer of post material 84 has been deposited such that it not only coats the edges of the tapered apertures 86, but also is deposited over the exposed portions of the patterned mirror layer 220 within the additional apertures 230. In FIG. 36C, it can be seen that the fabrication process has proceeded in a similar fashion to that described with respect to FIGS. 35F-35H, and that a released interferometric modulator has been formed. In particular, it can be seen that the patterned mirror layer 220 comprises stiffening structures 232 (e.g., annular rings) on the upper surface of the patterned mirror layer 220, formed from the same material as the posts 88. It can also be seen that the portion of the mechanical layer 92 overlying the stiffening structures 232 has been removed to form apertures 234. It will be understood that because the mirror layer 220 has been partially detached from the mechanical layer 92, the mechanical layer 92 need not comprise a continuous layer of material, but may instead comprise, for instance, strips of mechanical material extending between connector portions 222 and support structures such as posts 88. Thus, portions of the mechanical layer may be removed by the same patterning step that forms mechanical strips (see FIG. 8), as depicted in FIG. 36C, in order to ensure that no connection remains between the stiffening structures 232 and the overlying mechanical layer 92.

It will be understood that various combinations of the above embodiments are possible. For instance, in certain embodiments, certain of the support structures disclosed herein may be used in conjunction with other support structures disclosed herein, as well as other suitable support structures not discussed in this application. Various combinations of the support structures discussed above are contemplated and are within the scope of the invention. In addition, it will be understood that support structures formed by any of the methods above may be utilized in combination with other methods of forming support structures, in order to improve the rigidity and durability of those support structures.

It will also be recognized that the order of layers and the materials forming those layers in the above embodiments are merely exemplary. Moreover, in some embodiments, other layers, not shown, may be deposited and processed to form portions of an interferometric modulator element or to form other structures on the substrate. In other embodiments, these layers may be formed using alternative deposition, patterning, and etching materials and processes, may be deposited in a different order, or composed of different materials, as would be known to one of skill in the art.

It is also to be recognized that, depending on the embodiment, the acts or events of any methods described herein can be performed in other sequences, may be added, merged, or left out altogether (e.g., not all acts or events are necessary for the practice of the methods), unless the text specifically and clearly states otherwise.

While the above detailed description has shown, described, and pointed out novel features of the invention as applied to various embodiments, it will be understood that various omissions, substitutions, and changes in the form and details of the device of process illustrated may be made by those skilled in the art without departing from the spirit of the invention. As will be recognized, the present invention may be embodied within a form that does not provide all of the features and benefits set forth herein, as some features may be used or practiced separately from others.

We claim:

1. A method of fabricating an electromechanical device, comprising:
   providing a substrate;
   depositing an electrode layer over the substrate;
   depositing a sacrificial layer over the electrode layer;
   patterning the sacrificial layer to form apertures;
   depositing a conductive movable layer over the sacrificial layer;
   forming support structures overlying the movable layer and at least partially within apertures in the sacrificial layer, wherein the support structures extend over only a portion of the conductive movable layer; and
   etching the sacrificial layer to remove the sacrificial layer, thereby forming a cavity between the movable layer and the electrode layer.

2. The method of claim 1, wherein the movable layer includes a mechanical sublayer and a reflective sublayer.

3. The method of claim 2, wherein the mechanical sublayer is formed directly over the reflective sublayer.

4. The method of claim 2, wherein depositing the movable layer over the sacrificial layer comprises:
   depositing a reflective sublayer over the sacrificial layer;
   patterning the reflective sublayer;
   depositing a second sacrificial layer after and over the reflective sublayer; and
   depositing a mechanical sublayer after and over the reflective sublayer.

5. The method of claim 2, wherein the reflective sublayer comprises aluminum.

6. The method of claim 2, wherein the movable sublayer comprises at least one material selected from the group of: nickel and chromium.

7. The method of claim 2, wherein the reflective sublayer is deposited after the patterning of the sacrificial material, additionally comprising removing at least a portion of the reflective layer located along a base of the apertures in the sacrificial layer 8. The method of claim 2, wherein the reflective sublayer is deposited prior to the patterning of the sacrificial material.

9. The method of claim 1, wherein the support structures comprise at least one material selected from the group of: aluminum, $AlO_x$, silicon oxide, $SiN_x$, nickel, and chromium.

10. The method of claim 1, wherein forming the support structures comprises:
    depositing a layer of support material over the movable layer and at least partially within the apertures in the sacrificial layer; and
    patterning the layer of support material to form support structures located over the apertures.

11. The method of claim 10, additionally comprising:
    patterning the sacrificial layer to form annular holes, forming columns of sacrificial material; and
    depositing a layer of protective material over the sacrificial material, filling the annular holes with the layer of protective material, wherein the sacrificial material is selectively etchable relative to the protective material.

12. The method of claim 11, additionally comprising etching back the layer of protective material to expose the sacrificial layer, wherein said etching back is done prior to patterning the sacrificial layers to form apertures, and wherein said apertures are formed within the columns of sacrificial material.

13. The method of claim 12, additionally comprising removing the protective material to expose sides of the columns of sacrificial material, wherein the protective material is removed after the sacrificial layer has been etched to form the cavity 14. The method of claim 10, additionally comprising:
    forming at least one aperture in the movable layer; and
    etching a via through the sacrificial material extending from the at least one aperture in the movable layer to a layer underlying the sacrificial material, wherein the layer of support material fills the via.

15. The method of claim 14, wherein the layer of support material comprises a planarizing material.

16. The method of claim 14, wherein the at least one aperture in the movable layer is formed through a substantially horizontal portion of the movable layer.

17. The method of claim 14, wherein the movable layer comprises sidewalls within the aperture, and wherein the at least one aperture is formed through a sidewall of the movable layer.

18. The method of claim 10, wherein patterning the support layer to form at least one support structure further comprises patterning the support layer to form at least one rib structure located over the movable layer and away from the apertures in the sacrificial material.

19. The method of claim 10, additionally comprising polishing the support layer to reduce the height of the support structure.

20. The method of claim 10, wherein patterning the layer of support material comprises etching the support layer selectively relative to the movable layer.

21. The method of claim 10, wherein the movable layer comprises a substantially flat base portion, additionally comprising etching an aperture through at least a portion of the substantially flat base portion prior to depositing the layer of support material.

22. The method of claim 1, wherein forming the support structures comprises:
    depositing a mask over the movable layer;
    patterning the mask to define at least one aperture, wherein the aperture is located over one of the apertures in the sacrificial layer; and
    forming at least one support structure within the aperture in the mask by a plating process.

23. The method of claim 22, wherein the support structure is formed by an electroplating process.

24. The method of claim 1, wherein depositing the electrode layer over the substrate comprises:
    depositing a layer of ITO over the substrate; and depositing a layer of chromium over the layer of ITO.

25. The method of claim 1, additionally comprising depositing a partially reflective layer over the electrode layer, wherein the movable layer includes a mechanical sublayer and a reflective sublayer, the reflective sublayer located on the side of the movable layer facing the partially reflective layer.

26. The method of claim 1, additionally comprising patterning the electrode layer to form electrode apertures, wherein said electrode apertures are located underneath the apertures in the sacrificial layer.

27. The method of claim 1, additionally comprising depositing a dielectric layer between the electrode layer and the sacrificial material.

28. The method of claim 27, wherein the dielectric layer comprises silicon oxide.

29. The method of claim 1, additionally comprising depositing an adhesion enhancement layer over the movable layer prior to formation of the support structures.

30. The method of claim 1, additionally comprising depositing a protective layer over the support structure prior to etching the sacrificial material.

31. The method of claim 1, additionally comprising patterning the movable layer to form etch holes prior to etching the sacrificial layer.

32. The method of claim 1, additionally comprising forming a first lead in electrical connection with the movable layer, and a second lead in electrical connection with the electrode layer.

33. The method of claim 32, wherein forming the movable layer comprises depositing at least a mechanical layer.

34. The method of claim 33, wherein forming the first lead comprises depositing the mechanical layer on a portion of the substrate extending away from a portion of the mechanical layer overlying the sacrificial layer, and patterning the mechanical layer to form the first lead.

35. The method of claim 33, wherein forming the second lead comprises depositing the mechanical layer over an exposed portion of the electrode layer, and patterning the mechanical layer to form the second lead and to electrically isolate the second lead from a portion of the movable layer overlying the sacrificial material.

36. The method of claim 35, wherein the electrode layer comprises ITO and the mechanical layer comprises nickel, and wherein the nickel is deposited directly over an exposed portion of the ITO.

37. The method of claim 32, wherein forming the support structures comprises depositing a layer of support material, the support material comprising a non-conductive material, and wherein the layer of support material is deposited over at least one of said first and second leads, and remains over at least a portion of said lead to protect said lead.

38. The method of claim 37, wherein the layer of support material is deposited prior to patterning said at least one of said first and second leads.

39. The method of claim 37, wherein the layer of support material is deposited after patterning said at least one of said first and second leads.

* * * * *